(12) United States Patent
Singer et al.

(10) Patent No.: US 11,710,684 B2
(45) Date of Patent: Jul. 25, 2023

(54) PACKAGE WITH SEPARATE SUBSTRATE SECTIONS

(71) Applicant: Infineon Technologies AG, Neubiberg (DE)

(72) Inventors: Frank Singer, Regenstauf (DE); Martin Gruber, Schwandorf (DE); Thorsten Meyer, Regensburg (DE); Thorsten Scharf, Lappersdorf (DE); Peter Strobel, Regensburg (DE); Stefan Woetzel, Erfurt (DE)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 17/070,427

(22) Filed: Oct. 14, 2020

(65) Prior Publication Data
US 2021/0111108 A1 Apr. 15, 2021

(30) Foreign Application Priority Data
Oct. 15, 2019 (DE) .................... 10 2019 127 791.4

(51) Int. Cl.
H01L 23/495 (2006.01)
H01L 21/56 (2006.01)
H01L 23/31 (2006.01)
H01L 21/54 (2006.01)
H01L 23/16 (2006.01)

(52) U.S. Cl.
CPC ........ *H01L 23/49575* (2013.01); *H01L 21/54* (2013.01); *H01L 21/56* (2013.01); *H01L 23/16* (2013.01); *H01L 23/31* (2013.01); *H01L 23/49541* (2013.01)

(58) Field of Classification Search
CPC ... H01L 23/49575; H01L 21/54; H01L 21/56; H01L 23/16; H01L 23/31; H01L 23/49541; H01L 21/561; H01L 21/568; H01L 23/3107; H01L 2224/16245; H01L 2224/24245; H01L 2224/32245; H01L 2224/48247; H01L 2224/73265; H01L 2224/83385; H01L 2924/181
USPC ........................................................ 257/676
See application file for complete search history.

(56) References Cited

U.S. PATENT DOCUMENTS

| 6,379,997 B1 | 4/2002 | Kawahara et al. |
| 9,536,864 B2 * | 1/2017 | Hsu .................. H01L 25/50 |
| 2005/0017332 A1 | 1/2005 | Awad et al. |
| 2007/0148822 A1 | 6/2007 | Haba et al. |

(Continued)

FOREIGN PATENT DOCUMENTS

JP 2007157846 6/2007

*Primary Examiner* — Bo B Jang
*Assistant Examiner* — Dilinh P Nguyen
(74) *Attorney, Agent, or Firm* — Dicke, Billig & Czaja, PLLC

(57) ABSTRACT

A package is disclosed. In one example, the package comprises a substrate having at least one first recess on a front side and at least one second recess on a back side, wherein the substrate is separated into a plurality of separate substrate sections by the at least one first recess and the at least one second recess, an electronic component mounted on the front side of the substrate, and a single encapsulant filling at least part of the at least one first recess and at least part of the at least one second recess. The encapsulant fully circumferentially surrounds sidewalls of at least one of the substrate sections.

18 Claims, 20 Drawing Sheets

(56) References Cited

U.S. PATENT DOCUMENTS

| | | |
|---|---|---|
| 2012/0181680 A1 | 7/2012 | Li |
| 2012/0326288 A1 | 12/2012 | Huang et al. |
| 2013/0001761 A1 | 1/2013 | Rogren |
| 2013/0154120 A1 | 6/2013 | Do et al. |
| 2016/0225687 A1* | 8/2016 | Kim .................... H01L 23/3107 |
| 2016/0260656 A1* | 9/2016 | Hwang ............. H01L 23/49861 |
| 2018/0040551 A1 | 2/2018 | Lin et al. |
| 2018/0342438 A1 | 11/2018 | Chen et al. |
| 2019/0067212 A1 | 2/2019 | Cadag et al. |

* cited by examiner

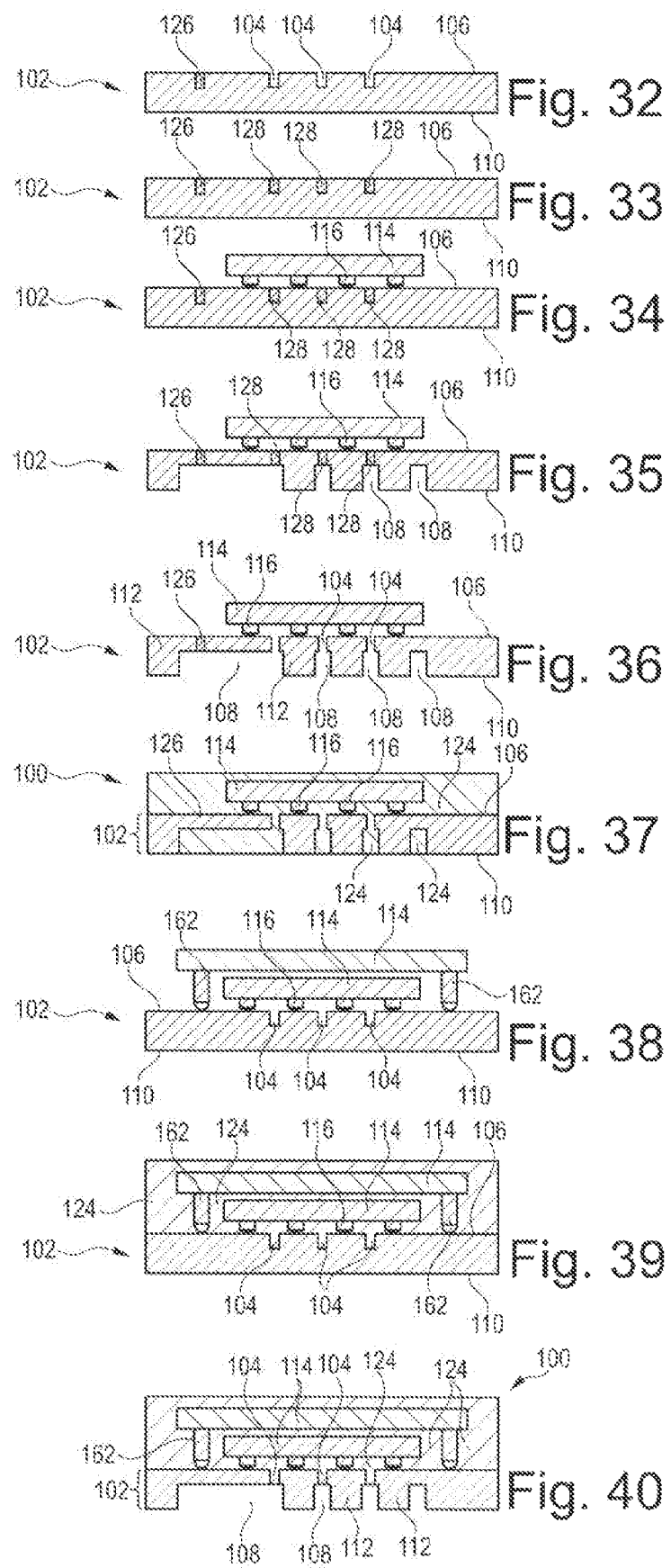

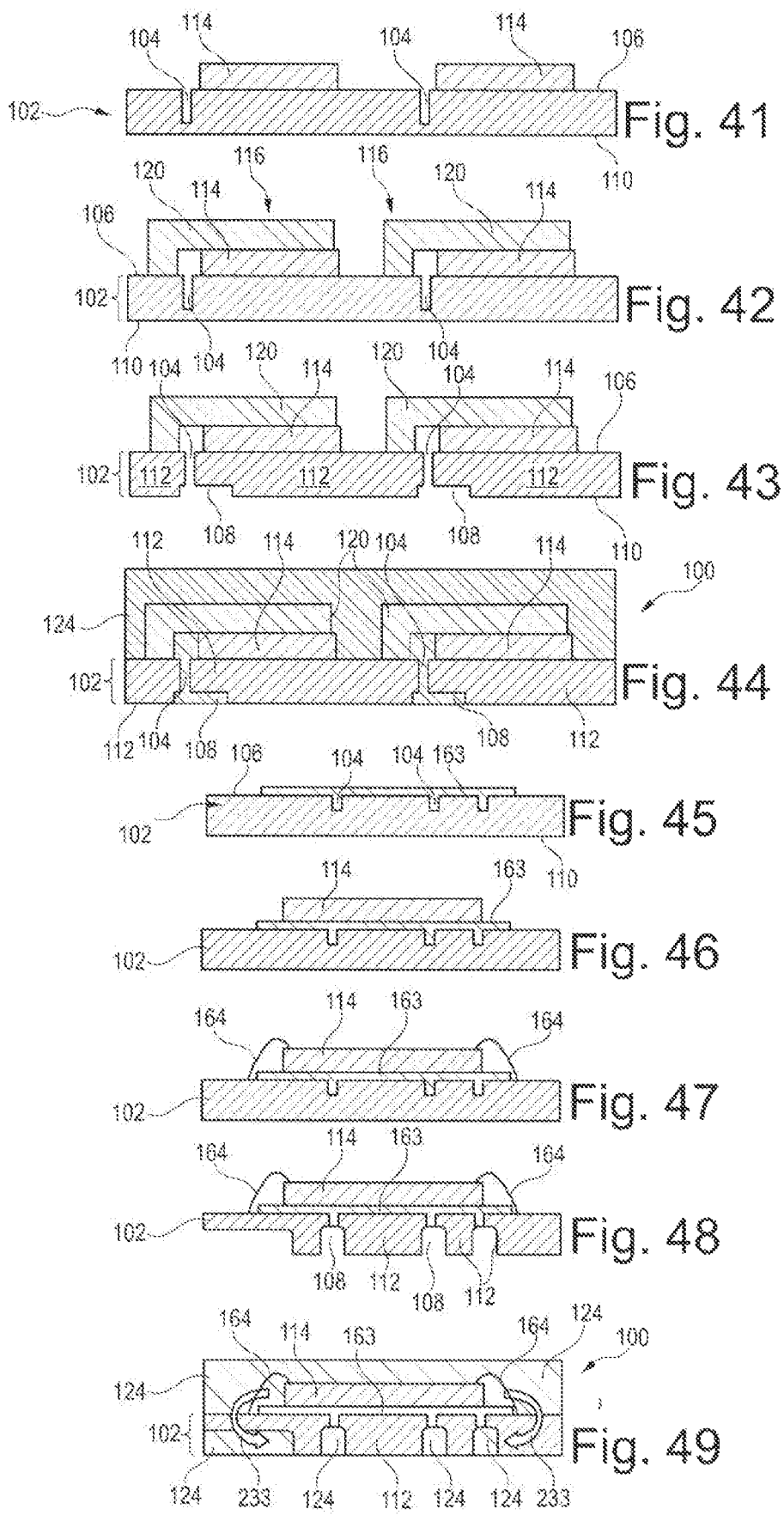

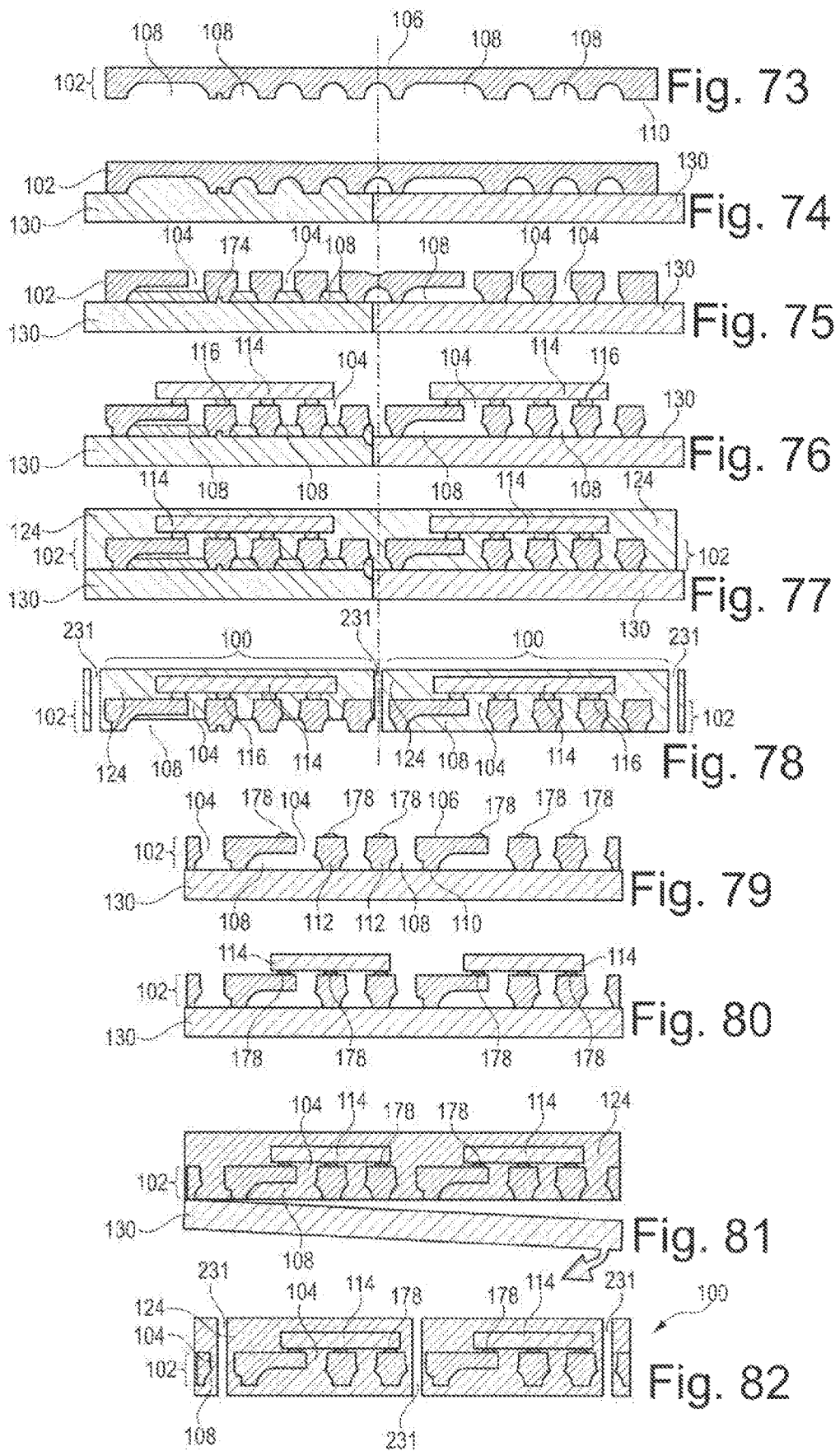

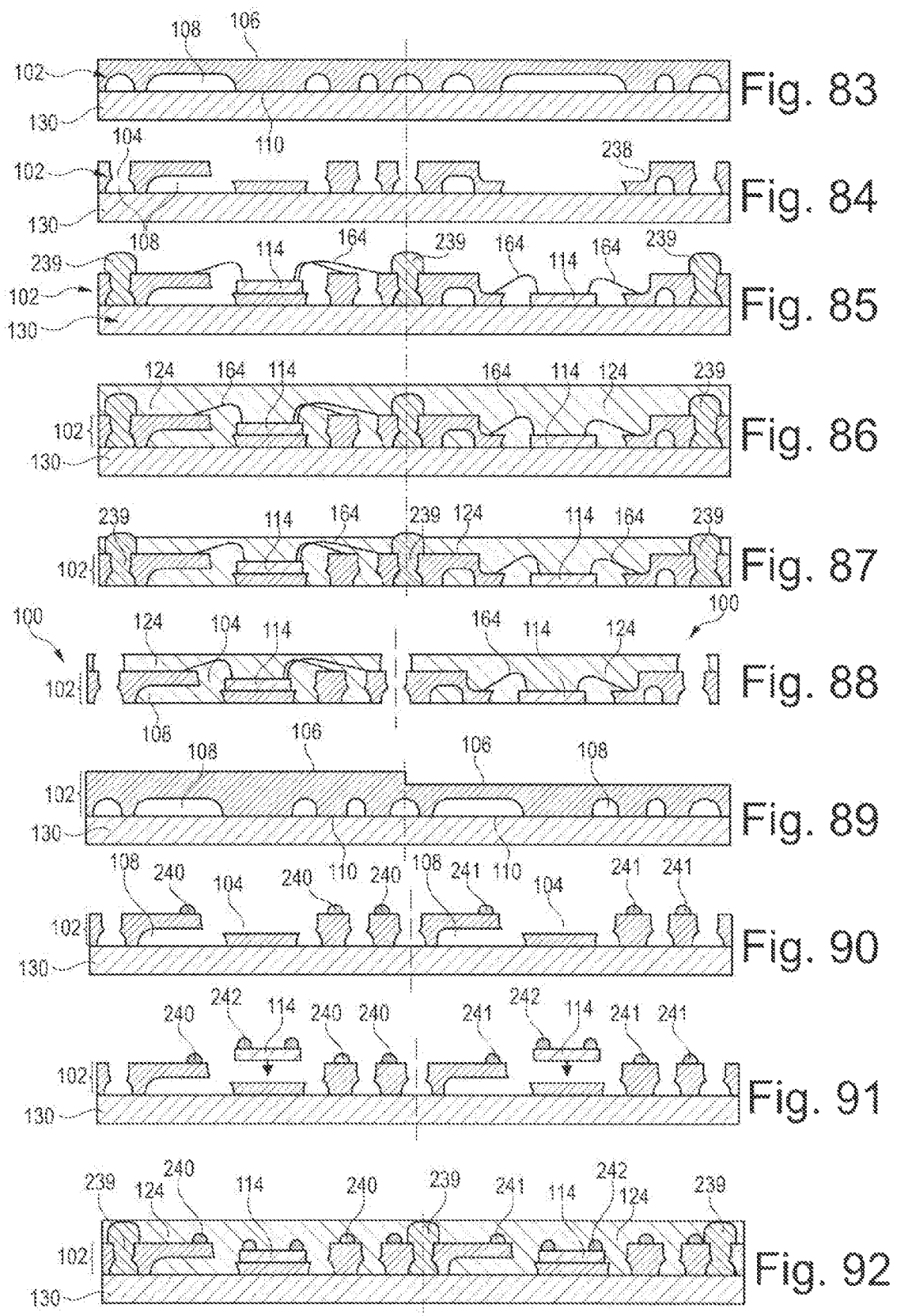

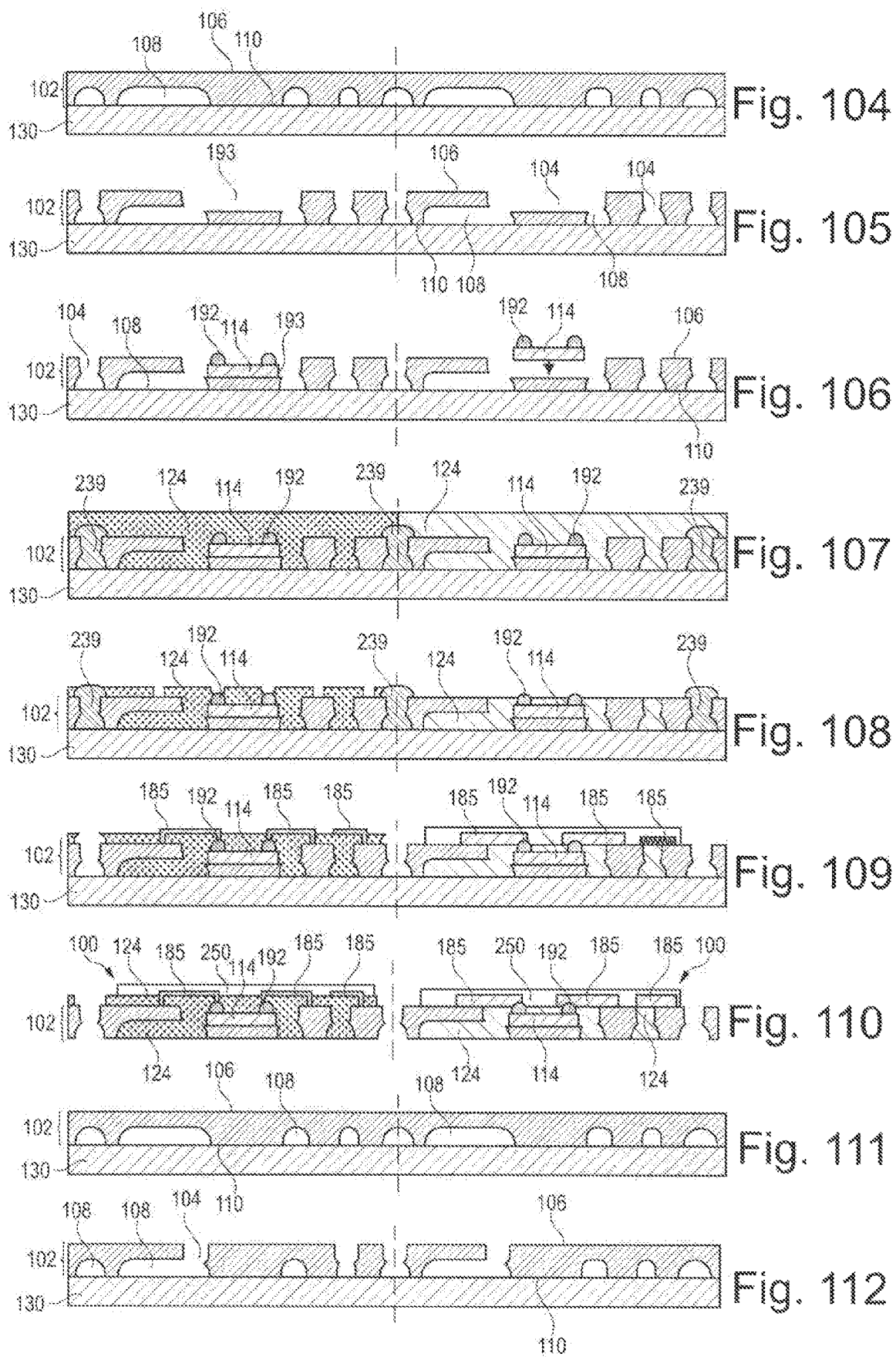

PACKAGE WITH SEPARATE SUBSTRATE SECTIONS

CROSS-REFERENCE TO RELATED APPLICATION

This Utility Patent Application claims priority to German Patent Application No. 10 2019 127 791.4, filed Oct. 15, 2019, which is incorporated herein by reference.

BACKGROUND

The present invention relates to a package and a method of manufacturing a package.

A package may comprise an electronic component, such as a semiconductor chip, mounted on a leadframe. Packages may be embodied as encapsulated electronic component mounted on a leadframe with electrical connects extending out of the encapsulant and being coupled with an electronic periphery.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the Drawings:

FIG. 32 to FIG. 37 illustrate structures obtained during carrying out a method of manufacturing packages, shown in FIG. 37, according to another exemplary embodiment.

FIG. 38 to FIG. 40 illustrate structures obtained during carrying out a method of manufacturing packages, shown in FIG. 40, according to another exemplary embodiment.

FIG. 41 to FIG. 44 illustrate structures obtained during carrying out a method of manufacturing packages, shown in FIG. 44, according to another exemplary embodiment.

FIG. 45 to FIG. 49 illustrate structures obtained during carrying out a method of manufacturing packages, shown in FIG. 49, according to another exemplary embodiment.

FIG. 73 to FIG. 78 illustrate structures obtained during carrying out a method of manufacturing packages, shown in FIG. 78, according to another exemplary embodiment.

FIG. 79 to FIG. 82 illustrate structures obtained during carrying out a method of manufacturing packages, shown in FIG. 82, according to another exemplary embodiment.

FIG. 83 to FIG. 88 illustrate structures obtained during carrying out a method of manufacturing packages, shown in FIG. 88, according to another exemplary embodiment.

FIG. 89 to FIG. 95 illustrate structures obtained during carrying out a method of manufacturing packages, shown in FIG. 95, according to another exemplary embodiment.

FIG. 104 to FIG. 110 illustrate structures obtained during carrying out a method of manufacturing packages, shown in FIG. 110, according to another exemplary embodiment.

FIG. 111 to FIG. 116 illustrate structures obtained during carrying out a method of manufacturing packages, shown in FIG. 116, according to another exemplary embodiment.

Figure 1:
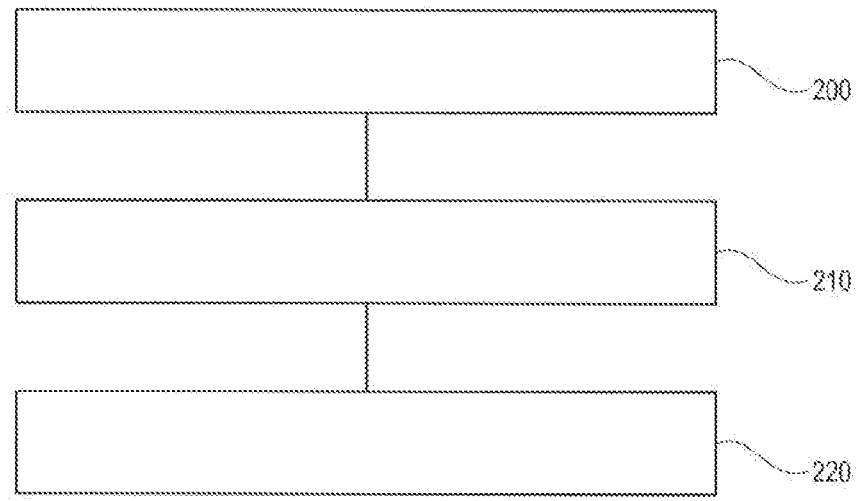
FIG. 1 illustrates a block diagram of a method of manufacturing packages according to an exemplary embodiment.

The illustration in the drawing is schematically and not to scale.

DETAILED DESCRIPTION

There is a need to manufacture a package with low effort.

According to an exemplary embodiment, a package is provided which comprises a substrate having at least one first recess on a front side and at least one second recess on a back side, wherein the substrate is separated into a plurality of separate substrate sections by the at least one first recess and the at least one second recess, an electronic component mounted on the front side of the substrate, and a single encapsulant filling at least part of the at least one first recess and at least part of the at least one second recess, wherein the encapsulant fully circumferentially surrounds sidewalls of at least one of the substrate sections along at least part of a (in particular along an entire) vertical extension of said at least one substrate section without being interrupted by said at least one substrate section (in particular so that the encapsulant disables a lateral electric access to said at least one substrate section) along an entire vertical extension over which the encapsulant surrounds said at least one substrate section.

According to another exemplary embodiment, a method of manufacturing a package is provided, wherein the method comprises mounting a carrier on and/or above a substrate, forming at least one first recess on a front side of the substrate, and forming at least one second recess on a back side of the substrate (in particular connecting with the at least one first recess to thereby form a through hole), so that the substrate is separated into a plurality of separate substrate sections by the at least one first recess and the at least one second recess and so that the separate substrate sections are held together, at least temporarily, by the carrier.

According to an exemplary embodiment, a package is provided in which front sided first recesses and back sided second recesses cooperate so as to form openings in a substrate which may be used for mechanically supporting and/or electrically connecting one more electronic components. Thereby, separate electrically conductive substrate sections are formed which can be connected for instance to the electronic component and/or with an electronic environment of the package so as to establish a proper electric connection within the package. For instance, first and second recesses of different lateral and/or vertical dimensions and/or positions may functionally cooperate so as to form redistribution structures, etc. The described manufacturing process is properly compatible with a batch manufacture of multiple packages at the same time, thereby promoting a high throughput on an industrial scale. At the same time, the manufactured packages show a proper electric and mechanical reliability. Advantageously, a single encapsulant may be sufficient for encapsulating constituents of the package and also contributing to holding together the constituents and the readily manufactured package. In particular, such an encapsulant may laterally fully circumferentially surround at least part of the substrate sections for supporting mechanical integrity of the package. It may also be advantageous to use a temporary (i.e. not forming part of the readily manufactured package) or permanent (i.e. forming part of the readily manufactured package) carrier for holding together separate substrate sections which may be created by separating a previously integral substrate by forming said recesses cooperating from the front side and the back side to separate the substrate.

In one aspect of an exemplary embodiment, the package may comprise only a single encapsulant (such as a single mold component). Said common encapsulant may partially or entirely fill the one more first recesses and may partially or entirely fill the one or more second recesses. Providing only a single encapsulant, a single encapsulation process is sufficient which significantly simplifies the manufacturing process.

Furthermore, this may allow keeping the number of material interfaces within the package small, which further improves the adhesion properties and thus the mechanical performance.

In a further aspect of an exemplary embodiment, the package may be manufactured using a carrier which—temporarily or permanently—holds together the mentioned separate substrate sections during at least part of the manufacturing process. By connecting a substrate with such a carrier, it is for instance possible to separate the substrate into said individual substrate sections without losing mechanical integrity. For instance, the connection of the carrier to the substrate may be accomplished after forming one or more recesses on one of the front side and the back side of the substrate and before forming further recesses on the respectively other side of the substrate. As a result, the substrate may be mechanically stabilized by the connected carrier during through hole formation by front side and back side processing. Thus, a high spatial accuracy of the constituents of the package may be guaranteed which may improve the mechanical integrity and the electric performance of the package.

In the following, further exemplary embodiments of the method and the package will be explained.

In the context of the present application, the term "package" may particularly denote an electronic device which may comprise for example one or more electronic components mounted on a substrate and optionally packaged using an encapsulant. Further optionally, one or more electrically conductive contact elements (such as bond wires or clips) may be implemented in a package, for instance for electrically coupling the electronic component(s) with the substrate.

In the context of the present application, the term "substrate" may particularly denote a support structure (preferably, but not necessarily electrically conductive) which serves as a mechanical support for the one or more electronic components, and which may also contribute to the electric connection between the electronic component(s) and the periphery of the package. In other words, the substrate may fulfil a mechanical support function and an electric connection function.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "recess" may particularly denote an opening, an indentation or a blind hole extending from a corresponding main surface of the for instance plate-shaped substrate into the material of the substrate. For instance, one or more first recesses may extend from a front side of first main surface into the for instance plate-shaped substrate, whereas the one or more second recesses may extend from a back side or opposing second main surface into the for instance plate-shaped substrate. For example, a respective first recess extending from the front side into the substrate and an assigned second recess extending from the back side into the substrate may combine so as to form a through hole extending through the entire for instance plate-shaped substrate. For example, the recesses may be formed by etching, mechanically drilling or laser drilling, i.e. by removing material of the substrate.

In the context of the present application, the term "substrate sections" may particularly denote individual island-shaped and (mechanically and/or electrically) unconnected portions of an initially integral body forming the substrate. Thus, the substrate sections may be physically separated and mutually spaced sections of the substrate body.

In the context of the present application, the term "encapsulant" may particularly denote a substantially electrically insulating and preferably thermally conductive material surrounding (for example hermetically surrounding) an electronic component and optionally part of a substrate to provide mechanical protection, electrical insulation, and optionally a contribution to heat removal during operation.

Such an encapsulant can be, for example, a mold compound. When encapsulating by molding, injection molding or transfer molding may be carried out, for example.

A gist of an exemplary embodiment is the provision of a panel level packaging concept in which an electronic component (in particular embodied as semiconductor die) is being placed on a half etched leadframe-like substrate body with first recesses or cavities facing towards the electronic component. The substrate may then be processed (in particular etched) from the back side subsequently to the assembly of the electronic component. The electronic component may be optionally protected from etchant by one or protective layers which can be sacrificial (i.e. that can be removed subsequently). The substrate can be singulated into separate substrate sections by the cooperating material removal procedures for forming the front sided first recesses and the back sided second recesses. The thereby created leadframe-like substrate sections may be held in place by a connection structure (such as a die-interconnect/-assembly layer). The resulting substrate sections (which may also be denoted as leadframe structures) can have one or more undercuts (formed by the cooperating first and second recesses) for increasing current creep distance, rerouting and accomplishing mold locking.

In an embodiment, the substrate sections are etched structures, i.e. are formed by front side etching to form the one or more first recesses and back side etching to form the one or second recesses. Correspondingly, the method may comprise forming at least one of the at least one first recess and the at least one second recess by etching. A person skilled in the art will understand that the shape of substrate sections created by etching are significantly different than those formed by other manufacturing processes, such as sawing. In other embodiments, the first and second recesses may however be formed by another process, for instance by laser cutting for creating laser machined structures, or by additive processing. Additionally or alternatively, it is also possible that said structures are formed by additive metal deposition, by imprinting, by hot embossing, by milling, and by erosion. Moreover, sand blasting and laser ablation can also be carried out for forming said structures.

In an embodiment, at least one of the substrate sections is fully circumferentially surrounded by the encapsulant. It is also possible that a vertical end face of said at least one substrate section having sidewalls being fully circumferentially surrounded by the encapsulant is electrically connected to the electronic component. Additionally or alternatively, it is possible that a vertical end face of said circumferentially encapsulated substrate section is exposed with respect to the encapsulant. Thus, substrate sections being fully encapsulated may nevertheless fulfil an electric function at their top end and/or at their bottom end.

In an embodiment, at least some of the substrate sections are lead structures. During operation of the package, said substrate sections may thus be used for conducting electric current.

In an embodiment, the at least one first recess and the at least one second recess form at least one through hole extending through the substrate. When a respective one of the one or more first recesses and an assigned one of the one or more second recesses together form a through hole extending through the entire thickness of the (for instance plate-shaped) substrate, the recesses may establish a desired separation of a previously integral substrate body into multiple individual substrate sections. Furthermore, such one or more through holes extending through the substrate body may also promote flow of a still flowable, liquid or viscous precursor of an encapsulant through the one or more through holes and therefore into gaps of the package. Thereafter, the encapsulant material may be solidified by curing and may remain for instance at least partially within the recesses.

In an embodiment, the at least one first recess has a different, in particular a smaller, lateral extension than the at least one second recess. When the first recess has a smaller lateral width (i.e. a smaller dimension in a plane perpendicular to a vertical thickness direction of a plate-shaped substrate), the substrate sections may provide an electric redistribution function. This means that they may establish a transfer function for translating between the small dimensions of the semiconductor world (for instance dimensions and distances of pads of the electronic component) and the larger dimensions of a mounting base (such as a printed circuit board, PCB) on which the package may be mounted.

In an embodiment, the at least one first recess and the at least one second recess form at least one undercut of the substrate at the back side. Forming such an undercut may increase the length of a creeping current to flow from an exterior of the package in an undesired way up to the electronic component in an interior of the package, preferably being encapsulated. Descriptively speaking, such undercuts may establish a complicated and long trajectory for such an undesired creeping current and may thus efficiently suppress creeping currents extending into an exterior of the package. Moreover, such one more undercuts may also promote proper interlocking between encapsulant and substrate sections.

In an embodiment, the package comprises a connection structure connecting the electronic component with at least part of the substrate sections and holding together the substrate sections. Correspondingly, the method may comprise connecting the electronic component with the substrate by a connection structure which holds together at least part of the substrate sections and which forms part of the readily manufactured package. In the context of the present application, the term "connection structure" may in particular denote a physical body or material holding together the electronic component and the multiple substrate sections. In other words, without the connection structure, the connection bodies and the electronic component might be unconnected prior to encapsulating. In particular, the connection structure may be a structure being provided in addition to an encapsulant. As a result, the connecting function of the connection body holding together in particular the otherwise individual substrate sections may already be operative before encapsulating substrate and electronic component, i.e. ensuring proper connection of the substrate sections and the electronic component during manufacturing a package. Thus, in order to combine electric functionality with a proper mechanical integrity, the individual substrate sections may be held together, even before encapsulating the package, by a connection structure connecting said substrate sections with the electronic component. By taking this measure, spatial accuracy of the individual constituents of the package may be ensured also at an early stage of the manufacturing process.

In an embodiment, the connection structure comprises a component attach structure, in particular comprising at least one of a solder structure and an underfill, by which the electronic component is attached to the front side of the substrate. Thus, the integral connection of the separate substrate sections may be established by a material by which the electronic component is mounted and connected on the substrate. For instance, such a material may be a solder material by which for example multiple pads of the electronic component are solder-connected with the different substrate sections.

Additionally or alternatively, the connection structure may be formed by an underfill which may be provided to a bottom surface of the electronic component facing the substrate on which it is mounted. Such an underfill may also contribute to the connection of the individual substrate sections. Therefore, the material of the connection structure may be electrically conductive (for instance may be provided by multiple separate solder dots) and/or may be electrically insulating (for instance a dielectric underfill).

In an embodiment, the connection structure comprises a clip connecting an upper main surface of the electronic component with the front side of the substrate. Thus, the connection structure may be a clip electrically connecting a pad on an upper main surface of the electronic component (i.e. a main surface of the electronic component opposing the substrate) with a main surface of the substrate on which the electronic component is mounted. Such a clip may thus fulfil a two-fold function, i.e. electrically connecting the electronic component with the substrate and additionally holding together the individual substrate sections in cooperation with the electronic component.

In an embodiment, it may also be possible that at least one bond wire (connecting an upper main surface of the electronic component with the front side of the substrate) contributes to or forms the connection structure. For instance, such a bond wire may have a circular cross-section or may have a flat cross-section (so that it may then be denoted as a bond ribbon). Even by bond wires, it may be possible to not only electrically connect the electronic component with the substrate, but in addition to that such one or more bond wires may also establish a connection between the electronic component and the multiple substrate sections, thereby holding the substrate sections together.

In an embodiment, at least part of the substrate sections has a different, in particular a smaller, lateral extension at the front side than at the back side. In particular, the substrate sections may thereby form a redistribution structure. In correspondence with the different dimensions and/or positions of the first recesses as compared to the second recesses, also the individual substrate sections delimited by the first and second recesses may have different dimensions and/or positions on the front side and the back side of the substrate structure of the substrate. For instance, the substrate sections may have larger dimensions on the back side as compared to the front side. As a result, the individual substrate sections may have a redistributing function.

In an embodiment, different substrate sections have different vertical extensions. By having different vertical extensions, it is further possible to configure the individual substrate sections so as to refine the electric functionality of the correspondingly separated substrate. For instance, some of the substrate sections may extend over a larger vertical dimension than other ones of the substrate sections.

In an embodiment, the package comprises at least one further electronic component mounted on the front side of the substrate. For instance, the electronic component and the at least one further electronic component may be arranged side-by-side on the substrate sections or vertically stacked above each other and above the substrate sections. For instance, a first electronic component and a second electronic component may be arranged juxtaposed on the same vertical level of the for instance plate-shaped substrate. By providing multiple electronic components, the electronic functionality of the package may be further refined. In a specific space-saving configuration in a horizontal plane, it is alternatively possible to vertically stack a first electronic component and a second electronic component. In particular, a lateral or horizontal extension of one of the electronic components may be larger than that of the other electronic component, so that the larger electronic component may span and cover the entire first electronic component. This may make it possible to provide a mechanical protection function for the smaller electronic component.

In an embodiment, the substrate is electrically conductive. More specifically, the substrate of the package may be a patterned metal plate. Said metal plate may be planar. Correspondingly, the various substrate sections may be coplanar, i.e. may all be located within a common plane defined by a previously planar metal plate. At the beginning of the manufacturing process, it is possible that the substrate is a continuous planar metal plate, which is then made subject to etching from both the front side and the back side for forming the recesses. By making the substrate of a metallic material, it may provide a proper electric conductivity. Configuring the substrate as a metal plate, in particular a planar metal plate, patterning the substrate into the individual substrate sections by the mentioned recesses can be carried out in a space-saving way in a vertical direction. Thus, a compact package may be created.

In another embodiment, the substrate comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the substrate may be embodied as a Direct Copper Bonding (DCB) substrate or a Direct Aluminium Bonding (DAB) substrate.

In an embodiment, the package comprises an encapsulant, in particular a mold compound, encapsulating only part of the substrate and at least part of the electronic component. Even after temporary or permanent connection of the substrate sections by the carrier or connection structure before encapsulation, the provision of an encapsulant may promote to glue the individual constituents of the package in place on a long term.

In an embodiment, a part of the electronic component is exposed with respect to the encapsulant. This may be advantageous in terms of heat removal from the surface exposed electronic component during operation of the package.

In an embodiment, the package comprises only a single encapsulant. When using only a single encapsulation procedure, an efficient and fast manufacture of the packages may be obtained.

In an embodiment, the substrate further comprises at least one locking recess filled at least partially with material the encapsulant to thereby lock the encapsulant with the substrate. By forming one or multiple locking recesses in addition to the first and second recesses, it may be possible that a still flowable precursor of the encapsulant (for instance mold material before solidifying) may flow into the one or more locking recesses to thereby establish a proper mutual locking between encapsulant material and substrate. For instance, such locking recesses may be blind holes or through holes extending partially or entirely through the substrate and being preferably configured so as to not separate the substrate in addition to the separating function of the first and second recesses.

In an embodiment, the method comprises mounting an electronic component on the front side of the substrate. In particular, it may be possible to use an arrangement composed of the electronic component and a temporary carrier body connected with the electronic component as the carrier. Alternatively, it may be possible to use the electronic component as permanent carrier.

In an embodiment, the method comprises mounting the carrier before forming at least one of the at least one first recess and the at least one second recess, in particular after forming the at least one first recess and before forming the at least one second recess. Consequently, the carrier may mechanically support the initially integral substrate while being separated into isolated island like substrate sections.

In an embodiment, the method comprises removing the carrier after completing formation of the at least one first recess and the at least one second recess and before completing manufacture of the package. Thus, the carrier may be a temporary carrier which does not form part of the readily manufactured package.

In an embodiment, the method comprises mounting the carrier at the front side of the substrate, which may at this point of time already comprise one or more first recesses on the front side. This is particularly appropriate for subsequently forming one more second recesses at the back side of the substrate to thereby separate the substrate. Substrate sections may be held together by the carrier, temporarily or permanently.

In an embodiment, the method comprises mounting the carrier to extend substantially over the entire extension of the substrate. As a result, a single carrier body may be used for holding together multiple substrate sections being separated by forming the above-mentioned recesses. This simplifies the manufacturing method.

In an embodiment, the method comprises at least partially filling at least one of the at least one first recess with a protective structure for protecting the electronic components during forming the at least one second recess, in particular by etching. By temporarily filling the first recesses and/or second recesses with a protective structure (which may also be denoted as a sacrificial structure) it may be ensured that a flow of material into undesired portions of the package during manufacture may be reliably prevented. For instance, the first recesses may be filled with said protective structure during forming the second recesses (for instance by wet etching) so as to avoid a processing fluid (such as a wet etchant) to flow through the presently formed second recesses and the previously formed first recesses to a front side of a substrate and up to the sensitive electronic component. After having completed formation of the second recesses, the protective structures may be removed from the first recesses so as to establish through holes in the substrate separating the latter into individual substrate sections. It is also possible that such a protective material is temporarily placed inside the second recess(es), for instance during molding, so as to prevent an undesired flow of mold compound into specific portions of the package during manufacture.

In an embodiment, the method comprises removing the protective structure after forming the at least one second recess. Thus, the protective structure may be of temporary nature, i.e. may be removed before completing manufacture of the package and may therefore not form part of the readily manufactured package.

In an embodiment, the method comprises forming the at least one first recess, in particular as at least one blind hole, before mounting the electronic component on the front side of the substrate. Thus, the first recesses may be created already before assembly of the electronic components, so that the sensitive electronic components (for instance tiny semiconductor chips) may be reliably prevented from being damaged during production of the first recesses, for instance by wet etching.

In an embodiment, the method comprises forming the at least one second recess after mounting the electronic component on the front side of the substrate. When forming the second recesses after assembly of the one or more electronic components on the front side of the substrate with already created first recesses, the electronic component may contribute to holding the substrate sections together after back side etching for forming the second recesses. Thus, the assembly process may be simplified, since it can be carried out on an integral substrate body.

In an embodiment, the method comprises mounting an upper main surface of the electronic component on a temporary carrier, thereafter encapsulating at least part of the electronic component and only part of the substrate by an encapsulant, and thereafter removing the temporary carrier from the electronic component. For instance, such a temporary carrier may be a support layer with an adhesive surface. Alternatively, such a temporary carrier may for instance be an adhesive glass plate or metal plate (for instance an aluminium plate) pressed on a corresponding counterpart of the package during production. In the described embodiment, the temporary carrier may be temporarily attached to the one or more electronic components and may be removed after completing formation of the one or more packages.

In another embodiment, the method comprises mounting the back side of the substrate on a temporary carrier, thereafter encapsulating at least part of the electronic component and only part of the substrate by an encapsulant, and thereafter removing the temporary carrier from the substrate. In said alternative embodiment, the temporary carrier may be temporarily connected to the substrate and may be removed before completing manufacture of the one or more packages.

In an embodiment, the method comprises encapsulating at least part of the electronic component and only part of the substrate with a mold type encapsulant by compression molding from the back side of the substrate. By compression molding, the mold material of the encapsulant may be supplied from a side of the substrate opposing the one or more electronic components.

In an embodiment, the method comprises guiding encapsulant material to the electronic component through at least one through hole of the substrate formed by the at least one first recess and the at least one second recess. The through holes in the substrate defining the various substrate sections and/or one or more through hole extending through the substrate may then be used for guiding mold material also to the side of the substrate on which the one or more electronic component is mounted. As a consequence, gaps surrounding the electronic component may be filled with encapsulant material.

In an embodiment, the method comprises manufacturing a plurality of packages simultaneously using a common substrate, and subsequently separating the packages. Thus, the manufacturing procedure may be carried out as a batch procedure of producing multiple packages on panel level together. This may improve the throughput of the manufacturing process and may enable manufacture of packages on an industrial scale.

In an embodiment, the method comprises encapsulating part of the common substrate and at least part of a plurality of electronic components of said packages simultaneously using a common encapsulant, and cutting only through material of the encapsulant, not through material of the substrate, when separating the packages. By singularizing a panel level body comprising multiple still integrally connected packages by removing only material of the encapsulant but not material of the substrate, the singularization process can be significantly simplified. For instance, cutting through a mold compound is significantly easier than cutting through a metallic material of the substrate. As a result, the efficiency of manufacturing the electronic packages may be significantly improved.

In an embodiment, the method comprises encapsulating the electronic component and the substrate with a mold type encapsulant, and thereafter exposing at least part of a back side of the substrate, in particular by wet blasting or grinding. By exposing part of the substrate after encapsulation, it may be ensured that the obtained package may be connected with an electronic periphery of the package. For instance, the electronic package may be mounted on a mounting body (such as a printed circuit board) by establishing an electrically conductive connection between the encapsulated electronic component and the mounting body. For instance, this can be accomplished by soldering the package via the exposed surface portions of the substrate on the mounting body.

In an embodiment, the electronic component is mounted on the substrate by at least one of the group consisting of a solder structure, a sinter structure, a welding structure, and a glue structure. However, other connection methods are possible as well.

In an embodiment, the substrate is configured as a bulk structure for mechanically supporting the mounted electronic component and/or for electrically contacting the mounted electronic component. Therefore, the substrate may fulfil a double function. On the one hand, the substrate may support the electronic component (for instance on a die pad), and additionally the substrate may electrically connect the mounted electronic component (for instance via an electrically conductive connection element such as a bond wire or a clip) to the electronic environment of the package.

In an embodiment, the package comprises a plurality of electronic components mounted on the substrate. Thus, the package may comprise one or more electronic components (for instance at least one passive component, such as a capacitor, and at least one active component, such as a semiconductor chip).

In an embodiment, the encapsulant may comprise a mold, in particular a plastic mold. For instance, a correspondingly encapsulated body (in particular electronic component with substrate) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. In other exemplary embodiments, the encapsulant may also be a laminate or a casting component.

In an embodiment, the package comprises an electrically conductive connection structure electrically connecting the mounted electronic component with the substrate. For instance, the electrically conductive connection structure may comprise at least one of the group consisting of a clip, a wire bond, and a ribbon bond. A clip may be a three-dimensionally bent plate type connection element which has two planar sections to be connected to an upper main surface of the respective electronic component and an upper main surface of the substrate, wherein the two mentioned planar sections are leaded by a slanted connection section. As an alternative to such a clip, it is possible to use a wire bond or ribbon bond which is a flexible electrically conductive wire or ribbon shaped body having one end portion connected to the upper main surface of the respective electronic component and having an opposing other end portion being electrically connected to the substrate.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

Before exemplary embodiments will be described in more detail referring to the Figures, some general considerations will be summarized based on which exemplary embodiments have been developed.

A first aspect of exemplary embodiments is the provision of a fan-in/fan-out panel level packaging concept. Descriptively speaking, this may refer to a platform concept which may allow obtaining reduced process effort due to the use of a leadframe-type substrate with routing structures.

Exemplary embodiments may allow to obtain a requested design freedom for features like scalability of input/output terminals and package size, features for high reliability (such as adhesion of mold to leadframe to achieve a proper mold locking) and features for current creepage distance. Furthermore, a manufacturing method according to an exemplary embodiment may be executable with low effort, in particular avoiding multiple molding processes and/or preventing slow singulation by dicing. According to exemplary embodiments described below in further detail, it may be possible to create very filigree features (for instance by forming back side recesses for increasing current creep distance) using a substrate design of a leadframe-like type. In particular, doing a second half etch of a pre-etched substrate after die attach to the for instance leadframe type substrate is a highly advantageous design option. In terms of molding, a single molding procedure may be sufficient according to an exemplary embodiment, i.e. in particular additional underfill processes may be dispensable. This may combine high stability and a reduced number of process stages.

According to an exemplary embodiment, an electronic component (such as a die) may be placed on a half etched metallic plate type substrate with cavities facing towards the electronic component. The substrate may be etched from the back side subsequently to the placement of the electronic component on the previously integral substrate. The electronic component may be protected from etchant by protective layers or structures which can be sacrificial (i.e. that can be removed before completing manufacture of the package). The singulated substrate sections may be held in place by a die-interconnect or die-assembly layer, or by other appropriate connection structure. Resulting separated substrate sections may have undercuts for advantageously increasing current creep distance, allowing electric rerouting and promoting mold locking.

In an embodiment, singulated substrate sections may be held in place by an embedded clip or clip frame. Advantageously, the singulated substrate sections may be held in place by a strong die attach layer. A die, or any other electronic component, may be supported during molding by a mass die transfer substrate. Furthermore, procedures with full leadframe routing options and a single molding stage capability may be provided. In an exemplary embodiment, even a mixed fan-in/fan-out package design may be possible. Very filigree rerouting structures within a mold body or another encapsulant may be possible as well. Within such a mold body or any other type of encapsulant, less distances may become possible than on the package surface due to current creepage requirements. In an embodiment, individual substrate sections (in particular single leadframe-like pins) may be fixed by one or more internal mold cavities (i.e. may be circumferentially surrounded by encapsulant material) that can protrude through a whole substrate thickness. Optionally, only outer lead pins may be provided with an additional mold anchoring. Advantageously, compression molding may be carried out from a substrate side facing away from one or surface mounted electronic components. Compression molding from the opposing side (on which one or more electronic components may be surface mounted) with mold flow under the component by passing through pin gaps (i.e. through holes separating the separate substrate sections) is another advantageous option. In different embodiments, the "planar metal plate type" substrate layout can be universal for different sizes of electronic components in one main direction. Moreover, a number of input/output contacts as well as a package size can be scalable.

According to a second aspect of exemplary embodiments, a highly rational packaging concept with rerouting capability may be provided. In particular, a platform concept is provided which may allow obtaining high parallel or at least high-speed processing capabilities of metal plate based packages.

This may overcome conventional issues such as high effort of conventional sequential or serial processes like panel handling, singulation, wiring and die attach. Such processes may be addressed by bringing together low effort parallel processing with package requirements like features for high reliability (such as adhesion of mold to substrate sections to obtain proper mold locking), features for creepage distance, LTI (lead tip inspection) features, etc. With exemplary embodiments, very filigree features (for instance undercut-creating back side recesses for increasing current creep distance) can be provided within a leadframe-like substrate design.

The mentioned substrate concept may be highly advantageous for parallel handling of individual devices without metal inside of the sawing street. This may result in a high dicing speed. Moreover, alternative singulation methods for instance by chemical removal of sacrificial structures can be applied. Along with the latter, LTI features can be provided. A single molding with no additional underfill processes or similar may be sufficient in exemplary embodiments. For the wiring, simple and highly parallel approaches are being targeted as they are capable of reducing manufacturing effort, in particular for large substrates.

In an embodiment, a half-etched metal plate-based substrate may be mounted to a temporary carrier facing the half-etched structures of the substrate. The second half etched structures may be etched at the other side of the substrate (for instance made of copper) in the mounted stage. Highly filigree structures and rerouting features can be created. Optionally, resulting leadframe islands or substrate sections may be fixed in position.

Advantageously, one or more sacrificial layers can be applied at the perimeter dimensions of individual devices within a panel in form of the substrate. Consequently, a highly parallel singulation by dissolving the sacrificial material can be applied. After die-attach and wire-bonding, the mold body can be formed in one processing stage covering all substrate undercuts as well as front side and back side of the die or other electronic component. Furthermore, it may be possible that a large panel can be formed with multiple regions of one large substrate. In case of wiring using a redistribution layer (RDL), the encapsulant (in particular a single mold body) can be used as dielectric layer of the RDL.

FIG. 1 illustrates a block diagram of a method of manufacturing a package according to an exemplary embodiment.

Referring to block 200, the method may comprise mounting a carrier on and/or above a substrate.

Referring to block 210, the method may comprise forming at least one first recess on a front side of the substrate.

Referring to block 220, the method may comprise forming at least one second recess on a back side of the substrate, so that the substrate is separated into a plurality of separate substrate sections by the at least one first recess and the at least one second recess and so that the separate substrate sections are held together, at least temporarily, by the carrier.

Figure 2:
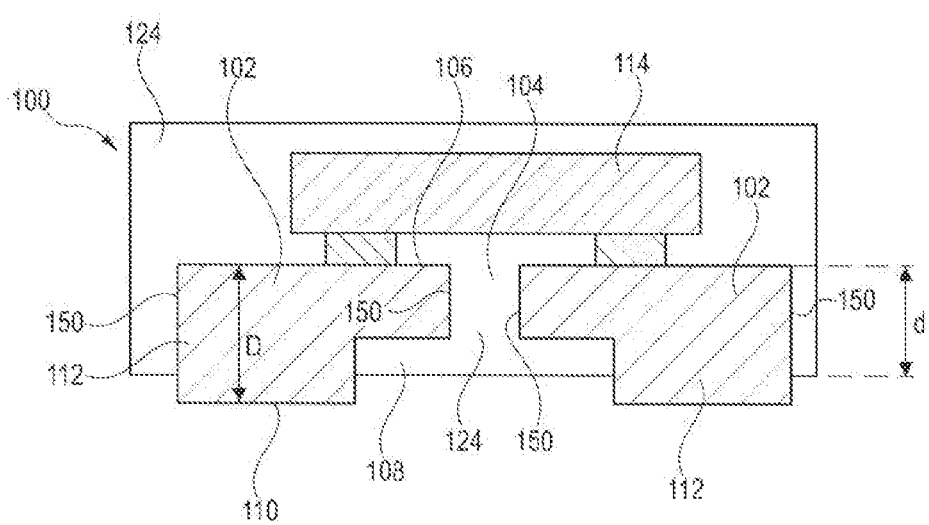
FIG. 2 illustrates a cross-sectional view of a package according to an exemplary embodiment.

FIG. 2 illustrates a cross-sectional view of a package 100 according to an exemplary embodiment.

The illustrated package 100 comprises a substrate 102 having a first recess 104 on a front side 106 and a second recess 108 on a back side 110. Furthermore, the substrate 102 is separated into separate substrate sections 112 by the first recess 104 and the second recess 108. Moreover, an electronic component 114 is mounted on the front side 106 of the substrate 102. Furthermore, a single encapsulant 124 is provided which fills the first recess 104 and part of the second recess 108. The encapsulant 124 fully circumferentially surrounds sidewalls 150 of the substrate sections 112 along part of a vertical extension D of the substrate sections 112 without being interrupted by said substrate sections 112. Thus, the encapsulant 124 disables a lateral electric access to said substrate sections 112 along an entire vertical extension d over which the encapsulant 124 surrounds said substrate sections 112.

Figure 3:
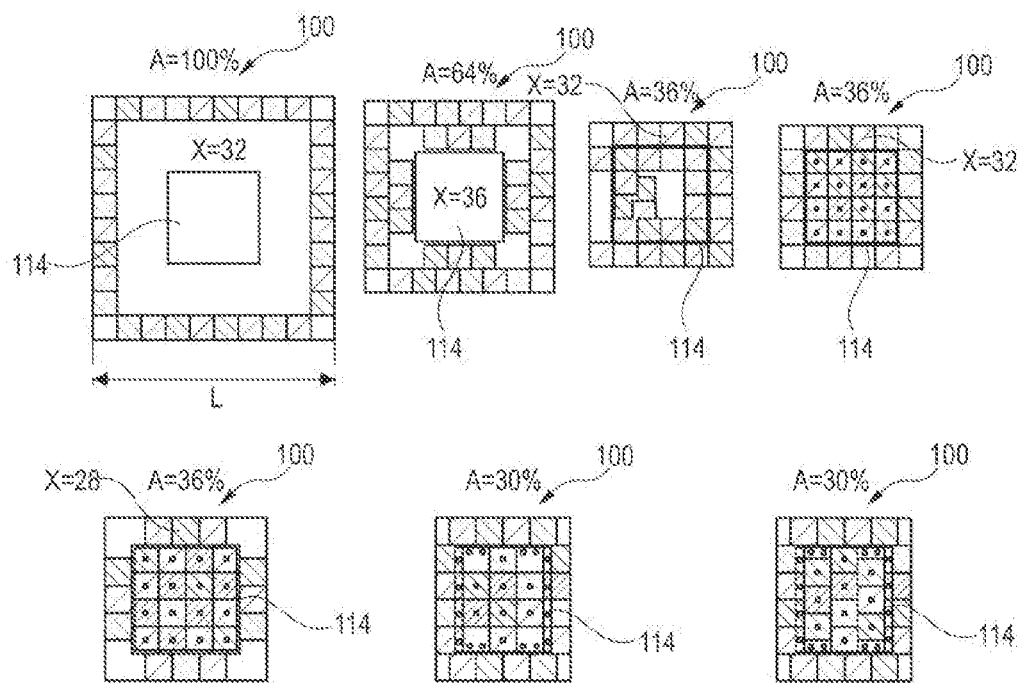
FIG. 3 illustrates plan views of packages with different areas and input/output counts according to other exemplary embodiments.

FIG. 3 illustrates plan views of packages 100 with different areas, A, and different input/output counts, X, according to other exemplary embodiments. With an area A of 100%, 32 input/output connections or pins may be established. Area A=100% corresponds to a package length L of 5 mm. With only 64% of this area, 36 input/output counts can be established. The same amount of 32 input/output connections can be established with an area of 36%. In another design, an area of 36% corresponds to 28 input/output connections. With 30% of the area, even 24 pins or connections may be provided. In an alternative design, an area of 30% corresponds to 26 connections or pins. With the area reduction from 100% to 30%, the pad pitch may be maintained. Exemplary embodiments may ensure a continued shrink. Furthermore, a reduced number of processing stages may be sufficient for manufacturing packages 100 according to exemplary embodiments. Such a package manufacturing concept is also scalable in terms of input/output connections. Thus, a high flexibility of a package designer may be combined with the opportunity to provide a fan-in and/or fan-out structure.

Figure 4:
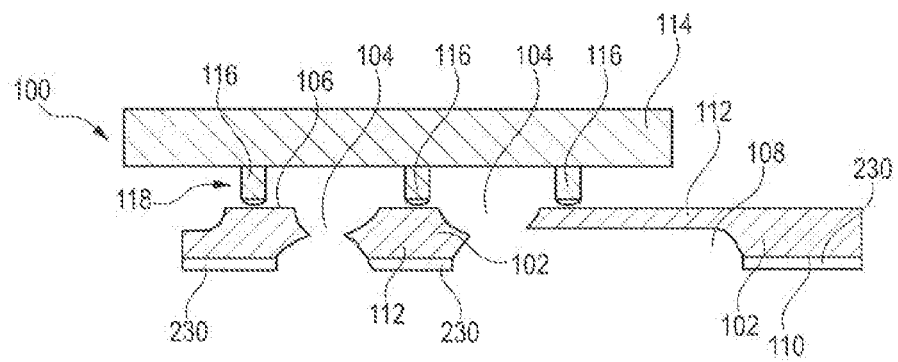
FIG. 4 to FIG. 6 illustrate structures (cross-sectional views in FIG. 4 and FIG. 5 and a plan view in FIG. 6) obtained during carrying out a method of manufacturing packages according to another exemplary embodiment.
Figure 5:
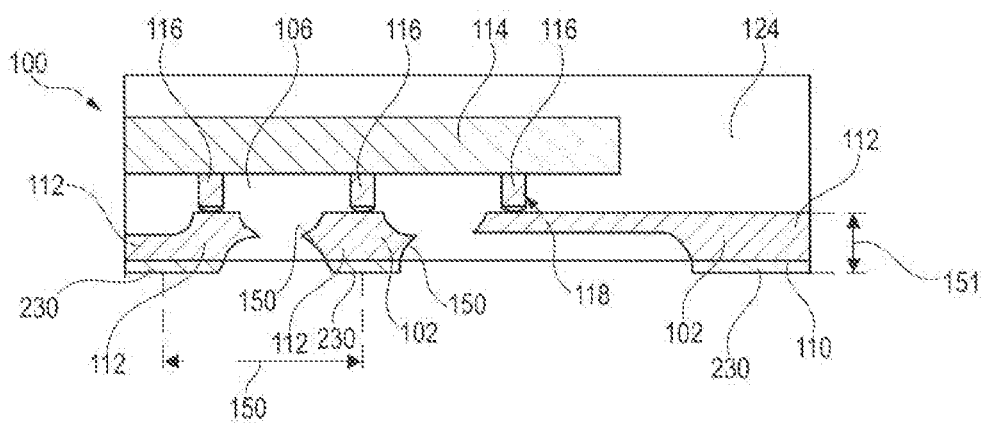
Figure 6:
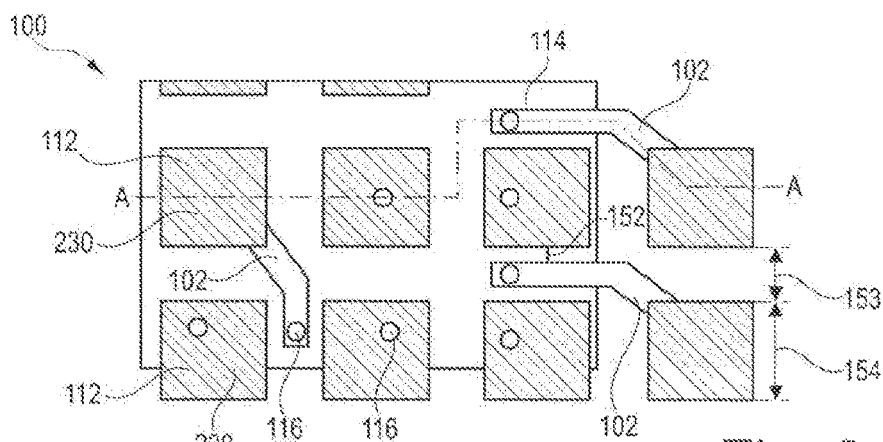

FIG. 4 to FIG. 6 illustrate structures (cross-sectional views in FIG. 4 and FIG. 5 and a plan view in FIG. 6) obtained during carrying out a method of manufacturing a package 100 according to another exemplary embodiment. The cross-sectional view of FIG. 4 corresponds to a cross-sectional trajectory denoted as A-A in FIG. 6. FIG. 5 shows the cross-sectional view of FIG. 4 after encapsulation by an encapsulant 124.

The illustrated package 100 comprises a copper substrate 102 having a plurality of first recesses 104 on a front side 106 and a plurality of second recesses 108 on a back side 110 of the substrate 102. In the shown embodiment, the substrate 102 is an etched patterned metal plate, in particular a patterned planar copper plate. As shown, the substrate 102 is separated into a plurality of separate substrate sections 112 by etching the recesses 104, 108 so that they combine in a pairwise fashion to form through holes. Consequently, the substrate sections 112 are etched structures forming lead structures. An electronic component 114, such as a semiconductor die, is mounted on the front side 106 of the substrate 102. A single mold type encapsulant 124 completely. Fills the recesses 104, 108. More specifically, the encapsulant 124 fully circumferentially surrounds sidewalls 150 of the central substrate section 112 in an annular way thereby forming a closed ring without being interrupted by said central substrate section 112. Consequently, the encapsulant 124 disables a lateral electric access to said central substrate section 112. An upper vertical end face of said substrate section 112 having sidewalls 150 being fully circumferentially surrounded by the encapsulant 124 is electrically connected to the electronic component 114. A lower vertical end face of said substrate section 112 is exposed with respect to the encapsulant 124 so as to be electrically connectable to an electronic environment of the package 100 by solder structures 230 or the like.

A connection structure 116 connects the electronic component 114 with the substrate sections 112 and holds together the substrate sections 112. More specifically, the connection structure 116 comprises a component attach structure 118 which may be a copper pillar with a connected solder structure.

Together, the first recesses 104 and the second recesses 108 form through holes extending through the substrate 102. As shown, the first recesses 104 have a smaller lateral or horizontal extension than the respectively assigned second recess 108. Due to the illustrated configuration, the first recesses 104 and the second recesses 108 form undercuts of the substrate 102 at the back side 110. Due to the described configuration of the recesses 104, 108, the substrate sections 112 has a smaller lateral extension at the front side 106 than at the back side 110. Thus, the substrate sections 112 form a redistribution structure encapsulated in the dielectric encapsulant 124.

Encapsulant 124, here embodied as a mold compound, encapsulates part of the substrate 102 and the electronic component 114. Advantageously, the package 100 comprises only a single encapsulant 124 to render the manufacturing process simple.

Referring to the embodiment of FIG. 4 to FIG. 6, a package 100 with fan-in/fan-out architecture may be provided. Reference sign 150 indicates the pitch, which may for instance be in a range from 300 μm to 800 μm. A maximum thickness 151 of the substrate 102 may be in a range from 100 μm to 400 μm, for instance 185 μm. As indicated with reference sign 152, compared to a package surface, a smaller distance may be possible for current creepage within the encapsulant 124 (which is a mold body in the shown embodiment). A dimension 153 may for instance be in a range between 150 μm and 250 μm. A dimension 154 may for instance be in a range between 150 μm and 450 μm.

Advantages of the embodiment of FIG. 4 to FIG. 6 are that a high density fan-in/fan-out architecture is provided. Furthermore, the encapsulant 124, here embodied as mold body, can be provided in such a way that it is possible to obtain a high mechanical integrity and a strong suppression of creepage currents in the package 100.

Figure 11:
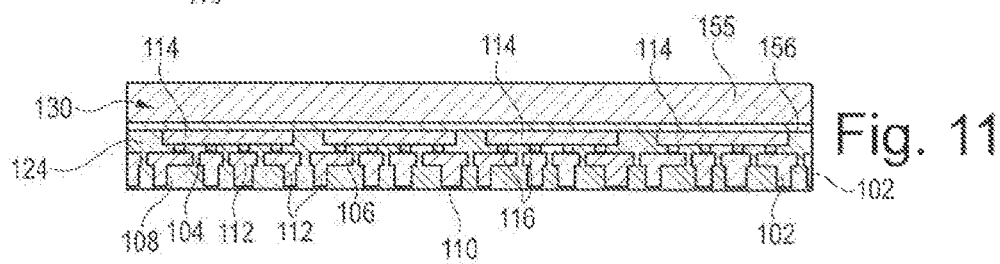
Figure 12:
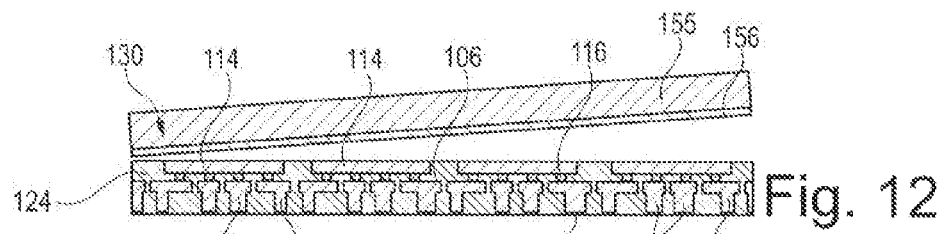
Figure 13:
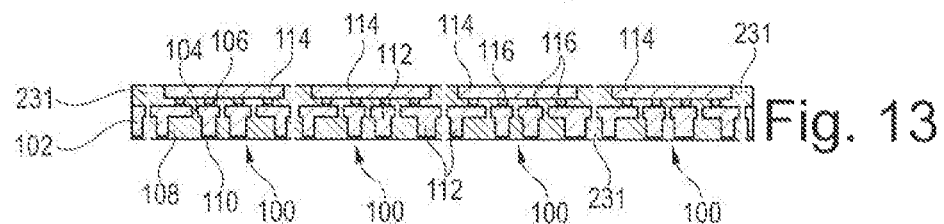

FIG. 7 to FIG. 13 illustrate structures obtained during carrying out a method of manufacturing packages 100, shown in FIG. 13, according to another exemplary embodiment.

Figure 7:
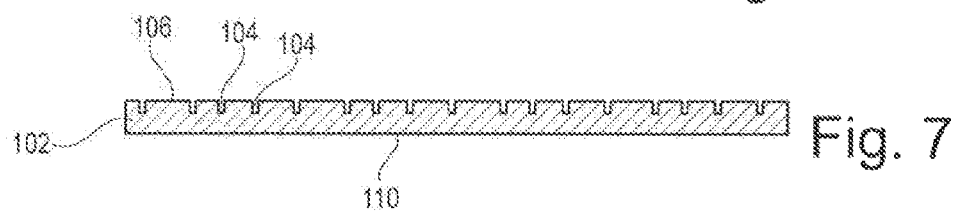
FIG. 7 to FIG. 13 illustrate structures obtained during carrying out a method of manufacturing packages, shown in FIG. 13, according to another exemplary embodiment.

Referring to FIG. 7, first recesses 104 are created as blind holes on the front side 106 of the substrate 102 prior to mounting electronic components 114 on the front side 106 of the substrate 102. This protects the electronic components 114 against an aggressive chemical involvement, for instance etching fluid.

Figure 8:
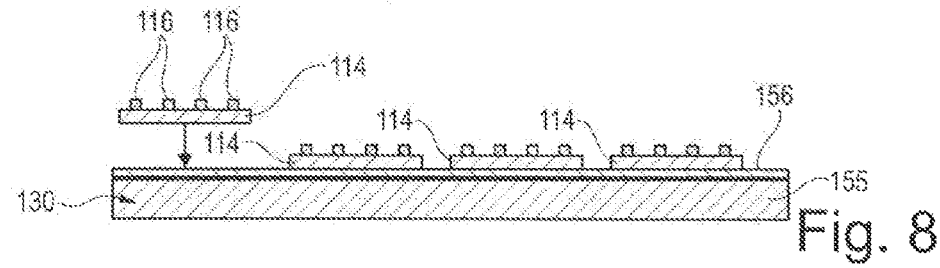

Referring to FIG. 8, a main surface of each of multiple electronic components 114 is mounted on a temporary carrier 130. The illustrated arrangement is compatible with a batch manufacturing process, i.e. allowing manufacturing a plurality of packages 100 simultaneously using a common substrate 102 and a common temporary carrier 130. The temporary carrier 130 is here embodied as a support layer or plate 155 with an adhesive layer 156 thereon. FIG. 8 illustrates the die transfer, i.e. the assembly of the electronic components 114 on the adhesive surface of the temporary carrier 130.

Figure 9:
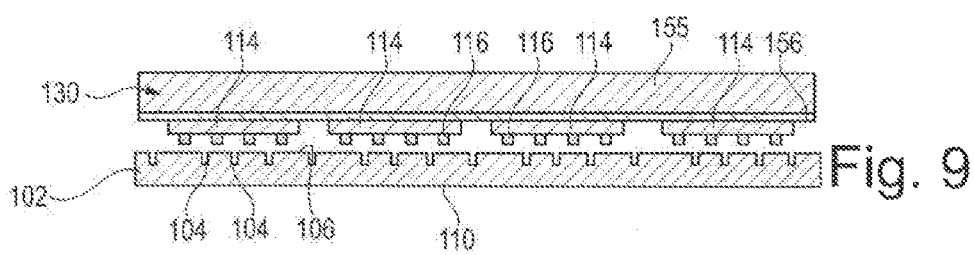

Referring to FIG. 9, the arrangement shown in FIG. 8 may be turned upside down. Subsequently, said arrangement of the electronic components 114 on the temporary carrier 130 is mounted on the front side 106 of the substrate 102 which has been prepared according to FIG. 7. As shown, the carrier 130 extends substantially over the entire horizontal extension of the substrate 102. As attached to the temporary carrier 130, the arrangement of multiple electronic components 114 may be transferred in parallel onto the front side 106 of the still integrally connected substrate 102.

It should be mentioned that different possible options for configuring the temporary carrier 130 are possible. For instance, the temporary carrier 130 may be a support body with adhesion tape (for instance glass with thermoplastic, dicing tape, etc.), a PDMS (polydimethylsiloxane) substrate allowing to be connected using Van Der Waals forces, a support body (such as a plate) using glass, metal, ceramic, polymer or silicon, etc.

Figure 10:
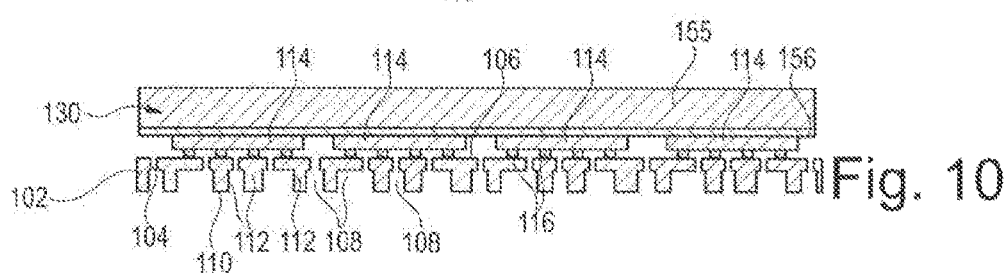

Referring to FIG. 10, the electronic components 114 are connected with the substrate 102 by connection structures 116 on the electronic components 114, for instance by soldering.

Thereafter, second recesses 108 are formed on a back side 110 of the substrate 102 so that the substrate 102 is separated into a plurality of separate substrate sections 112. This separation is accomplished by forming through holes in the substrate 102 by the combination of the first recesses 104 and the second recesses 108 connecting to the first recesses 104. The second recesses 108 are formed after mounting the temporary carrier 130 with the electronic components 114 on the front side 106 of the substrate 102. As shown, mounting the carrier 130 occurs only after forming the first recesses 104 and before forming the second recesses 108.

Descriptively speaking, the separate substrate sections 112 are held together temporarily by the carrier 130 in collaboration with the electronic components 114 and the connection structures 116 thereon. In other words, the electronic components 114 on temporary carrier 130 are connected with the substrate 102 by connection structures 116 which hold together the individual island shaped substrate sections 112.

As shown in FIG. 10, the die type electronic components 114 may be attached in parallel to the front side 106 of the front side etched metal plate of substrate 102. Such a connection can for instance be established by soldering, welding (for instance nano-wired), etc. In order to obtain the structure shown in FIG. 10, a second or back side etch may be carried out with the substrate 102 for forming the second recesses 108 on the back side 110 of the plate-shaped metallic substrate 102. The first etch has been carried out on the front side 106 of the substrate 102 for obtaining the structure shown in FIG. 7, i.e. by a front side etching.

Referring to FIG. 11, the electronic components 114 and the substrate 102, which has meanwhile been separated into separate island like substrate sections 112, are encapsulated by a common homogeneous encapsulant 124. Encapsulant 124 may be configured as a mold type encapsulant 124 which can be created by compression molding and may be supplied from the back side 110 of the substrate 102. Advantageously, the separated substrate sections 112 of the substrate 102 and the plurality of electronic components 114 are encapsulated simultaneously using only one common encapsulant 124. As shown, most of the substrate sections 112 are fully circumferentially surrounded by the encapsulant 124.

Since the carrier 130 with the electronic components 114 thereon is mounted at the front side 106 of the substrate 102, the back side 110 remains free and exposed for back side etching. Thereby, it becomes possible to form the second recesses 108 on the back side 110 connecting with the first recesses 104 on the front side 106 to thereby form through holes extending through the entire substrate 102 and separating the latter into the multiple substrate sections 112.

Only a single encapsulant 124 filling the first recesses 104 and filling the second recess 108 is provided. In other words, the manufacturing process can be carried out with only a single encapsulation process during the entire manufacture of packages 100. This keeps the number of material interfaces small and the manufacturing process simple. In order to obtain the structure shown in FIG. 11, a for instance mold assisted molding process may be carried out for filling empty gaps between the recessed substrate 102 and the electronic components 114 mounted thereon with material of the encapsulant 124.

Referring to FIG. 12, the temporary carrier 130 is removed from an integral body composed of the electronic components 114, the patterned substrate 102 and the encapsulant 124. Hence, the method comprises removing the temporary carrier 130 after completing formation of the first recesses 104 and the second recesses 108 and before completing manufacture of the packages 100. The provision of the temporary carrier 130 may ensure mechanical integrity of the multi-body intermediate structure obtained when the substrate 102 is separated into individual unconnected substrate sections 112 by forming the second recesses 108. The temporary carrier 130 may be demounted and removed from the still integrally connected multiple packages 100 after encapsulation. After encapsulation, the obtained integral multiple package body has sufficient mechanical stability so as to properly hold together its constituents even without the temporary carrier 130.

The body shown in FIG. 12 may then be made subject to a material removing process for exposing the substrate sections 112 at the back side 110, for instance by back side wet blasting or grinding. It is also possible to combine a foil assisted molding procedure with a subsequent deflashing process.

Referring to FIG. 13, the packages 100 may be separated or singularized from the previously integral multiple package body by cutting along separation lines 231 only through material of the encapsulant 124, not through material of the substrate 102. In order to obtain the individual packages 100 shown in FIG. 13, the body obtained after exposing portions of the substrate 102 may be diced. Thus, a simple singularization process is obtained which makes cutting through metallic portions of the multi-package body dispensable. Advantageously, a proper interlocking between substrate 102 and encapsulant 124 may be obtained. Furthermore, the die type electronic components 114 are exposed at their upper main surface which may be advantageous in terms of heat removal during operation of the packages 100.

Figure 17:
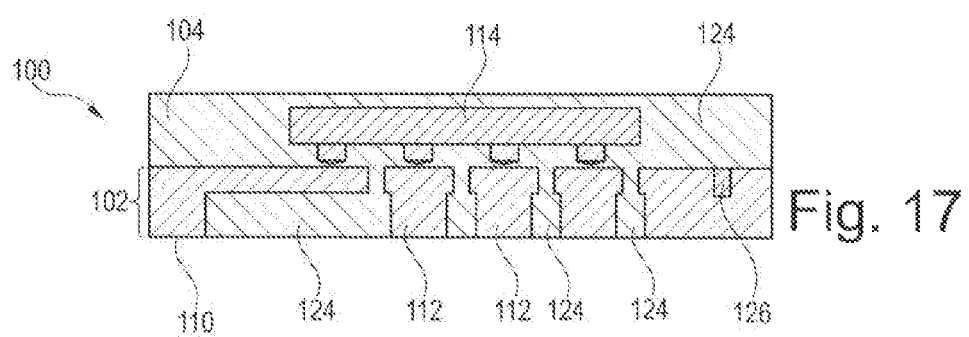
Figure 18:
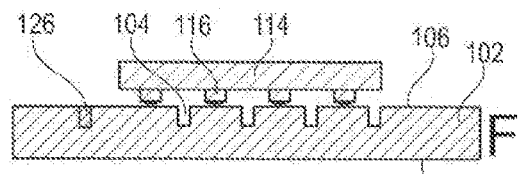
FIG. 18 to FIG. 21 illustrate structures obtained during carrying out a method of manufacturing packages, shown in FIG. 21, according to another exemplary embodiment.
Figure 19:
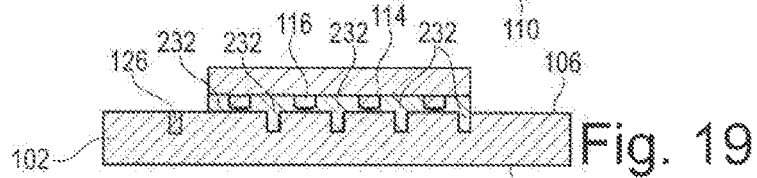
Figure 20:
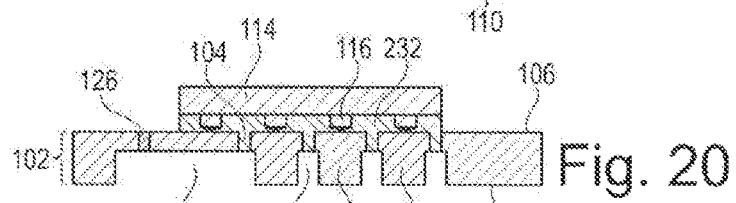

FIG. 14 to FIG. 17 illustrate structures obtained during carrying out a method of manufacturing a package 100, shown in FIG. 17, according to another exemplary embodiment. In this embodiment, the manufacturing method comprises guiding encapsulant material to the electronic component 114 through the through holes of the substrate 102 formed by the first recesses 104 and the second recesses 108.

Advantageously, the substrate 102 further comprises a locking recess 126 which does not separate the substrate 102 into the separate substrate sections 112 and is filled with material of the encapsulant 124 to thereby lock the encapsulant 124 with the substrate 102.

Figure 14:
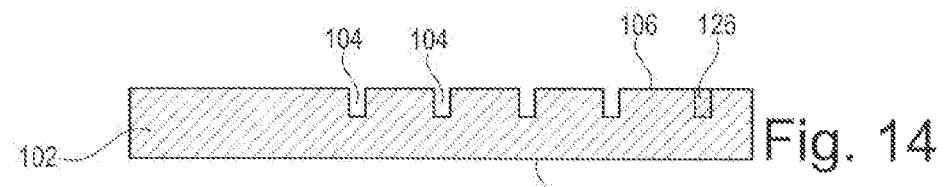
FIG. 14 to FIG. 17 illustrate structures obtained during carrying out a method of manufacturing packages, shown in FIG. 17, according to another exemplary embodiment.
Figure 15:
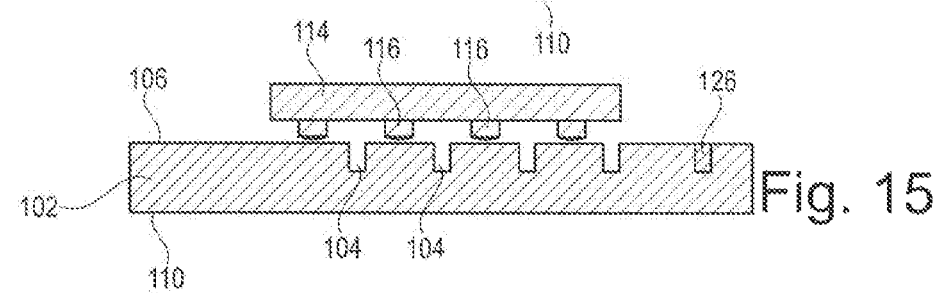
Figure 16:
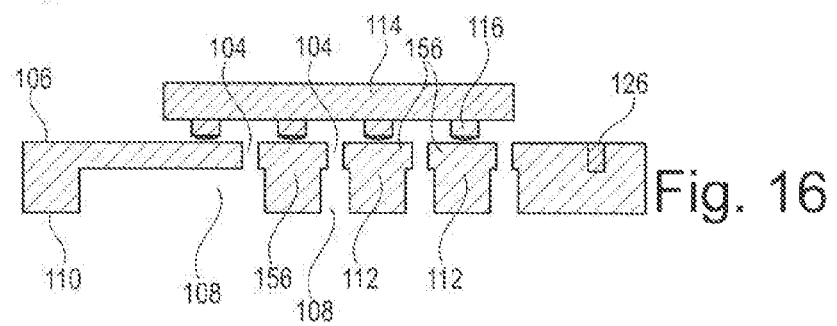

According to FIG. 14, a substrate 102 with first recesses 104 on the front side 106 is shown. In FIG. 15, an electronic component 114 is attached on the half etched integral substrate 102. After die attach, the structure shown in FIG. 15 may be etched from the back side 110 for forming the second recesses 108 (being larger than the first recesses 104 in a horizontal plane) to thereby obtain the structure shown in FIG. 16. As indicated by reference sign 156, this etching procedure may also create copper pillars in the substrate 102. In order to obtain package 100 shown in FIG. 17, a molding process may be carried out so as to form the mold type encapsulant 124. As shown, the locking recess(es) 126 may serve for obtaining a better mold locking or anchoring. When the package 100 is formed in a batch procedure together with multiple other packages, a dicing procedure can be carried out.

Figure 21:
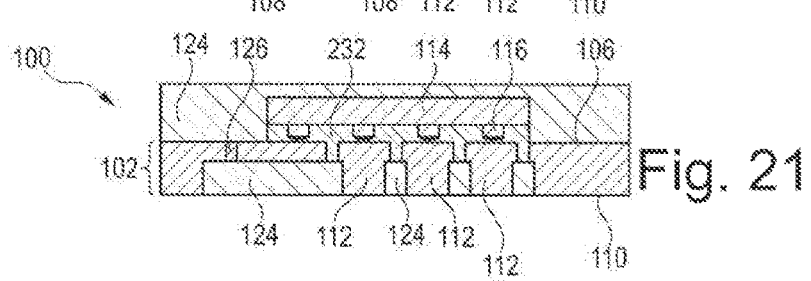

FIG. 18 to FIG. 21 illustrate structures obtained during carrying out a method of manufacturing a package 100, shown in FIG. 21, according to another exemplary embodiment. The embodiment of FIG. 18 to FIG. 21 differs from the embodiment of FIG. 14 to FIG. 17 in particular in that an underfill 232 is provided between the front side 106 of the substrate 102 and the electronic component 114. Such an underfill 232 may also fill the first recesses 104 on the front side 106 of the substrate 102. The electronic component 114 may thus be protected during back side etching for forming the second recesses 108 by the underfill 232 functioning as an etch stop.

Figure 23:
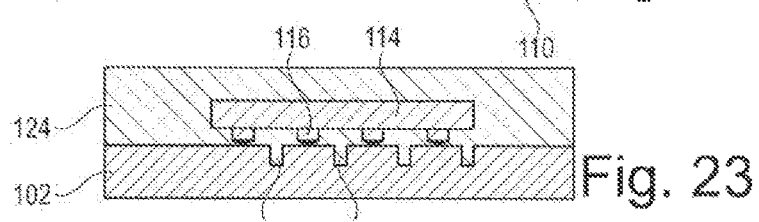
Figure 24:
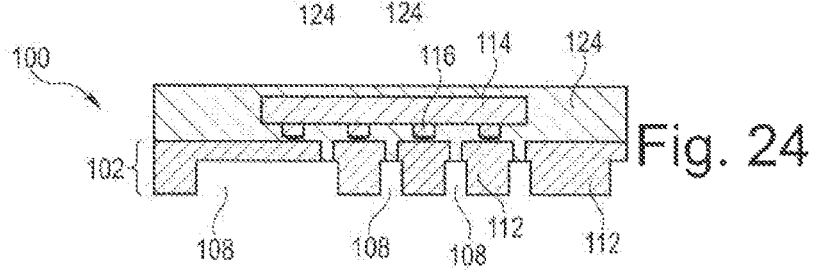
Figure 25:
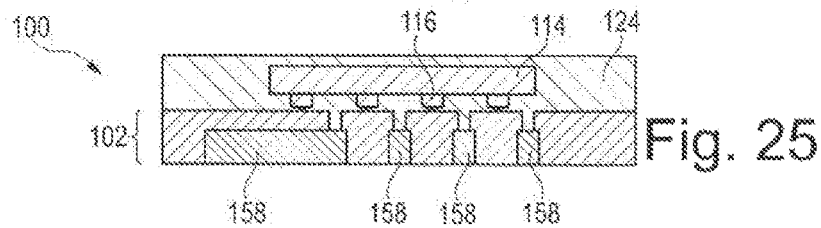
Figure 26:
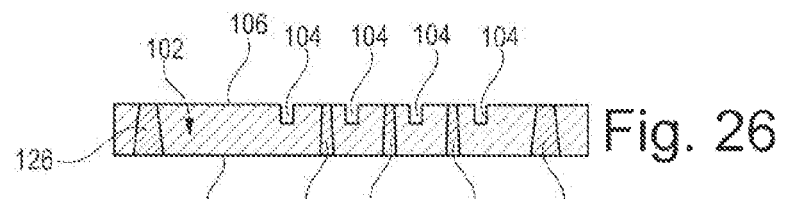
FIG. 26 to FIG. 29 illustrate structures obtained during carrying out a method of manufacturing packages, shown in FIG. 29, according to another exemplary embodiment.
Figure 27:
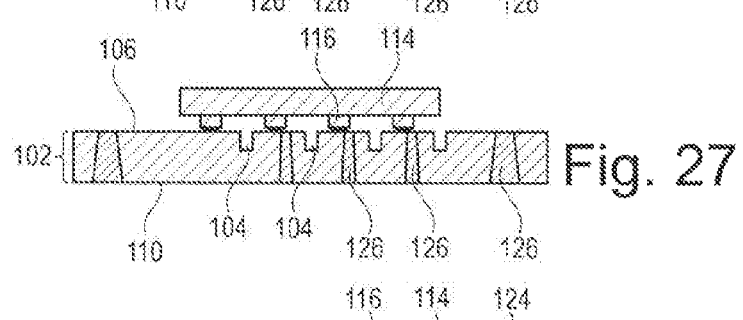
Figure 28:
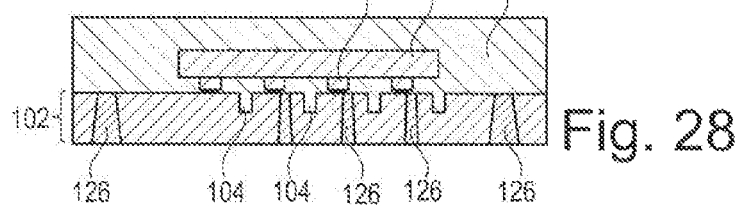

FIG. 22 to FIG. 25 illustrate structures obtained during carrying out a method of manufacturing a package 100, shown in FIG. 25, according to another exemplary embodiment. The embodiment of FIG. 22 to FIG. 25 differs from the previously described embodiments in particular in that encapsulation is carried out prior to back side etching for forming the second recesses 108. Furthermore, as shown in FIG. 25, an optional back side filling or molding procedure may be carried out for filling the second recesses 108. By taking this measure, a further encapsulant 158 may be formed filling the second recesses 108.

Figure 29:
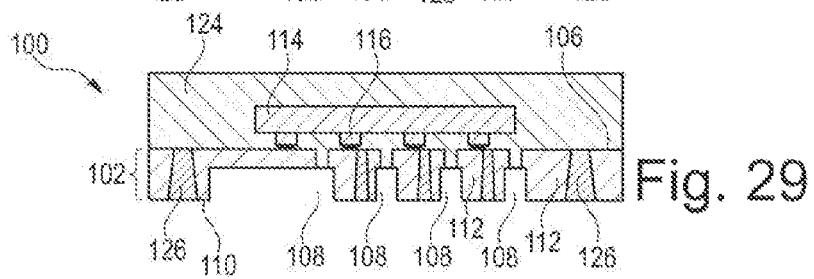
Figure 30:
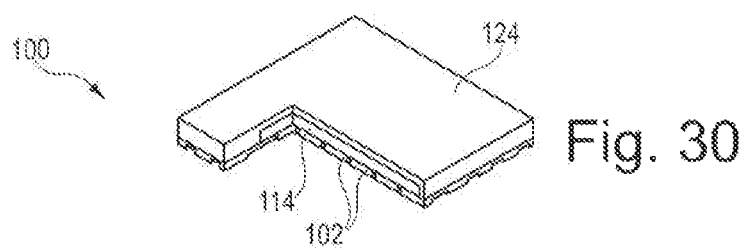
FIG. 30 and FIG. 31 show three-dimensional views of a package obtained by a manufacturing method according to FIG. 26 to FIG. 29 according to an exemplary embodiment.
Figure 31:
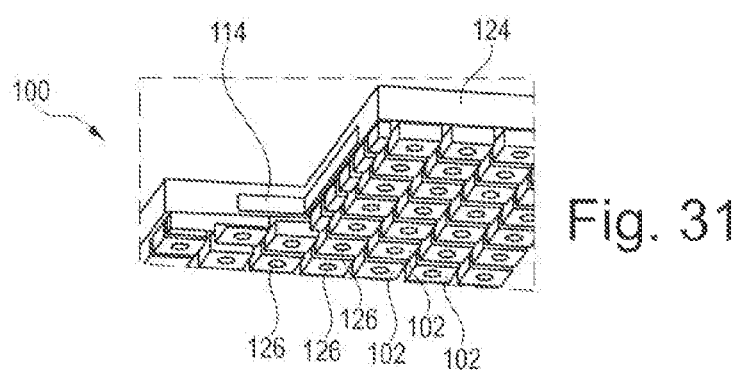

FIG. 26 to FIG. 29 illustrate structures obtained during carrying out a method of manufacturing a package 100, shown in FIG. 29, according to another exemplary embodiment. FIG. 30 and FIG. 31 show three-dimensional views of a package 100 obtained by a manufacturing method according to FIG. 26 to FIG. 29 according to an exemplary embodiment. The embodiment of FIG. 26 to FIG. 31 differs from the embodiment described referring to FIG. 22 to FIG. 25 in that, in addition to the first recesses 104 and the second recesses 108, further through holes are formed (for instance with a frustoconical shape) extending through the substrate 102 and serving as locking recesses 126 to be filled with material of the encapsulant 124 for enhancing mechanical integrity of the package 100. During the (for instance molding type) encapsulation, said through holes may also be filled with mold compound. In the described embodiment, the second recesses 108 may remain unfilled of encapsulant material.

FIG. 32 to FIG. 37 illustrate structures obtained during carrying out a method of manufacturing a package 100, shown in FIG. 37, according to another exemplary embodiment. In this embodiment, the manufacturing method comprises filling the first recesses 104 with a sacrificial protective structure 128 for protecting the electronic components 114 during forming the second recesses 108 by etching. The protective structure 128 may be removed after forming the second recesses 108.

The embodiment shown in FIG. 32 to FIG. 37 differs from the embodiment shown in FIG. 14 to FIG. 17 in particular in that the protective structure 128 (or sacrificial layer) is formed to temporarily fill the first recesses 104 during formation of the second recesses 108. As a result, wet etchant or other processing fluids are prevented from flowing from the back side 110 of the substrate 102 to its front side 106 and thus to the electronic component 114 during forming the second recesses 108 by back side etching. As shown, the protective structure 128 or sacrificial layer may be removed after back side etching. As a result, mold compound may also fill the first recesses 104 and may flow between the front side 106 and the back side 110 of the substrate 102. Reference numeral 126 shows a hole within a lead pin which serves as a locking recess during encapsulation.

FIG. 38 to FIG. 40 illustrate structures obtained during carrying out a method of manufacturing a package 100, shown in FIG. 40, according to another exemplary embodiment. The manufactured package 100 comprises a further electronic component 114 mounted on the front side 106 of the substrate 102. More specifically, the electronic component 114 and the further electronic component 114 are surface mounted on the front side 106 of the substrate 102 and are at the same time arranged in a vertically stacked configuration.

Figure 22:
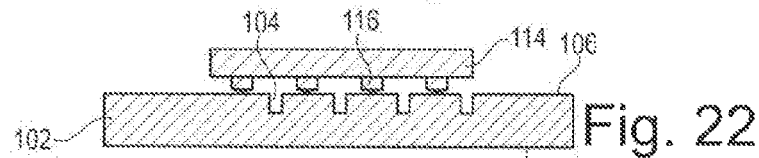
FIG. 22 to FIG. 25 illustrate structures obtained during carrying out a method of manufacturing packages, shown in FIG. 25, according to another exemplary embodiment.

The embodiment of FIG. 38 to FIG. 40 differs from the embodiment of FIG. 22 to FIG. 24 in particular in that FIG. 38 to FIG. 40 show a stacked arrangement of two surface mounted electronic components 114. A first electronic component 114 is soldered onto the front side 106 of the substrate 102. A further electronic component 114 is also soldered on the front side 106 of the substrate 102 but has a larger lateral extension so that it is arranged to cover the smaller electronic component 114 which is therefore accommodated in a gap between the larger further electronic component 114 and the substrate 102. A sufficiently large gap or accommodation volume may be created by pillars 162 connecting the larger further electronic component 114 with the front side 106 of the substrate 102. After surface-mounting the electronic components 114, a molding procedure may be carried out, followed by a back etch for forming the second recesses 108.

FIG. 41 to FIG. 44 illustrate structures obtained during carrying out a method of manufacturing one or more packages 100, shown in FIG. 44, according to another exemplary embodiment. In the illustrated embodiment, the connection structure 116 comprises clips 120 connecting an upper main surface of the electronic components 114 with the front side 106 of the substrate 102.

The embodiment of FIG. 41 to FIG. 44 differs from the previously described embodiments in that clips 120 are provided according to FIG. 41 to FIG. 44 for electrically and mechanically connecting an upper main surface of the electronic components 114 with the front side 106 of the substrate 102. By taking this measure, an electric connection may be established between one or more pads on the upper main surface of the electronic components 114 and the front side 106 of the substrate 102. The clips 120 may be made of an electrically conductive material such as copper and may be soldered or welded on the electronic components 114 as well as on the substrate 102. Furthermore, the clips 120 may contribute to the integral connection of the separate substrate sections 112 of the substrate 102, in collaboration with the respective electronic component 114.

The shown clip configuration may be particularly advantageous for power semiconductor chips with a vertical current flow. For instance, the electronic components 114 shown in FIG. 41 to FIG. 44 may be field effect transistor chips having a drain pad on one main surface and a source pad and a gate pad on the other main surface. The current may flow vertically through the respective electronic component 114. The connection of the one or more pads on the lower main surface of the electronic component 114 may be established by the substrate 102, whereas an electric connection of one or more pads on the upper main surface of the respective electronic component 114 may be provided by the clip 120. Simultaneously, the clips 120 may function as connection structure 116.

FIG. 45 to FIG. 49 illustrate structures obtained during carrying out a method of manufacturing a package 100, shown in FIG. 49, according to another exemplary embodiment.

The embodiment of FIG. 45 to FIG. 49 differs from the previously described embodiment in particular in that an adhesive attach film 163 is attached to the front side 106 of the substrate 102, and also fills the first recesses 104. The electronic component 114 can then be attached to the adhesive attach film 163. Thereafter, one or more pads on an upper main surface of the electronic component 114 may be connected with the front side 106 of the substrate 102 by bond wires 164, i.e. by wire bonding. During back side etching for forming the second recesses 108, the adhesive attach film 163 avoids a flow of etchant to the electronic component 114. During encapsulation (for instance by molding), material of the encapsulant 124 may flow from the front side 106 through gaps (see reference signs 233) between lead pins to the back side of the electronic component 114, which may be a die. Thus, the described embodiment may use a strongly adhesive die attach film 163 to hold lead pins in place. For instance, such an adhesive attach film 163 may be DDAF (Dicing Die Attach Film), etc. In cooperation or alone, the die attach film 163 and the bond wires 164 may function as a connection structure 116 provisionally holding together the individual substrate sections 112 during the formation of the second recesses 108 and during encapsulation, see FIG. 48.

Figure 50:
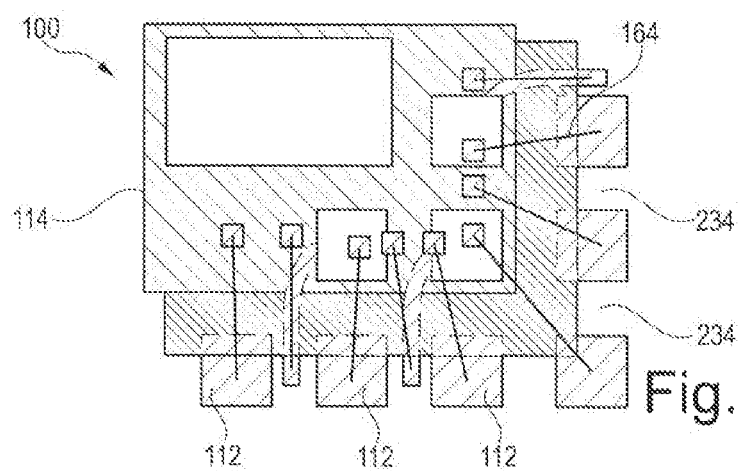
FIG. 50 to FIG. 52 illustrate structures (cross-sectional views in FIG. 51 and FIG. 52 and a plan view in FIG. 50) obtained during carrying out a method of manufacturing packages according to another exemplary embodiment.
Figure 51:
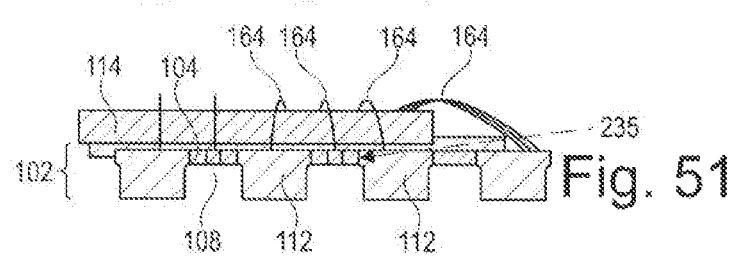
Figure 52:
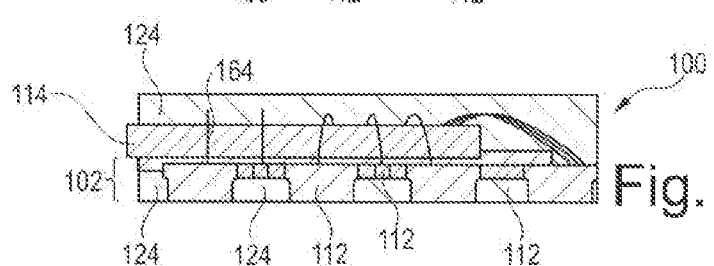

FIG. 50 to FIG. 52 illustrate structures (cross-sectional views in FIG. 51 before encapsulation and FIG. 52 after encapsulation, and a plan view in FIG. 50) obtained during carrying out a method of manufacturing a package 100 according to another exemplary embodiment. FIG. 50 shows gaps 234 between the respective pins. FIG. 51 indicates schematically a smaller etching depth (see reference sign 235) from the front side 106, which enables creation of finer structures.

FIG. 53 to FIG. 72 shows structures of packages 100 according to other exemplary embodiments.

Figure 53:
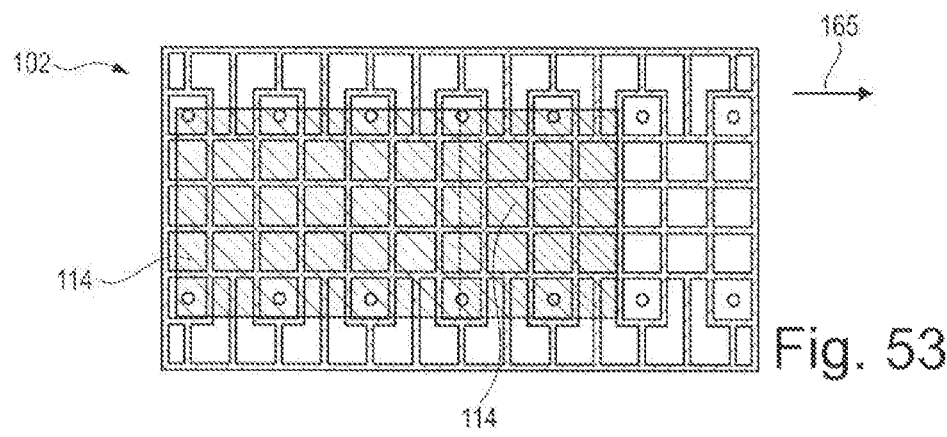
FIG. 53 to FIG. 72 shows structures of packages according to other exemplary embodiments.

FIG. 53 shows a scalable pin count leadframe and a corresponding sheet design. In a main direction 165, a scalable size of electronic components 114 is enabled. Thus, a universal leadframe pattern is provided which is compatible with electronic components 114 of different dimensions.

Figure 54:
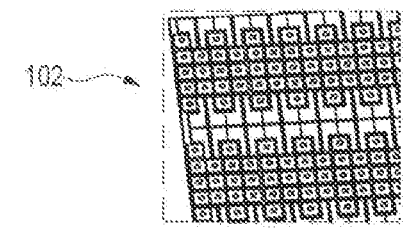
Figure 55:
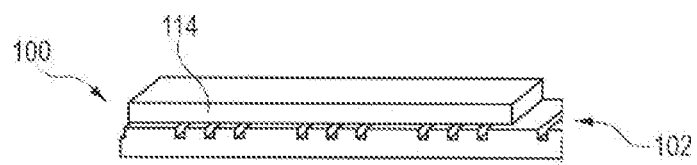
Figure 56:
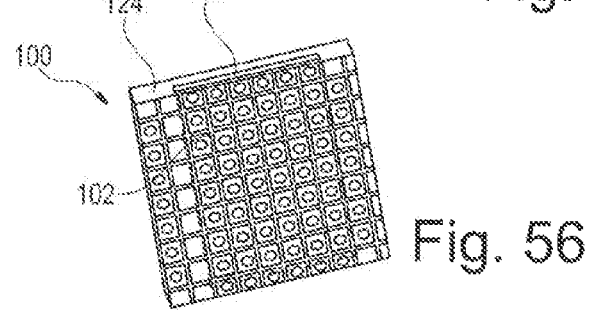
Figure 57:
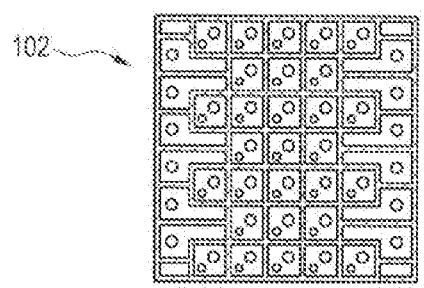
Figure 58:
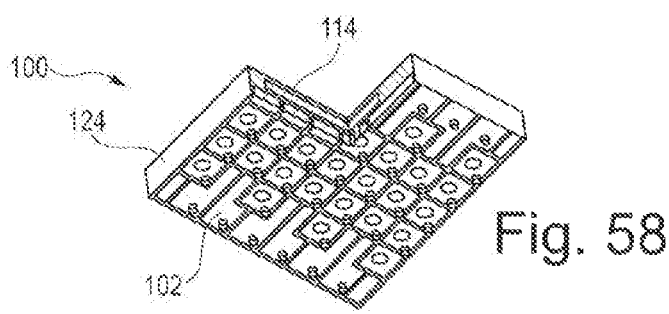
Figure 59:
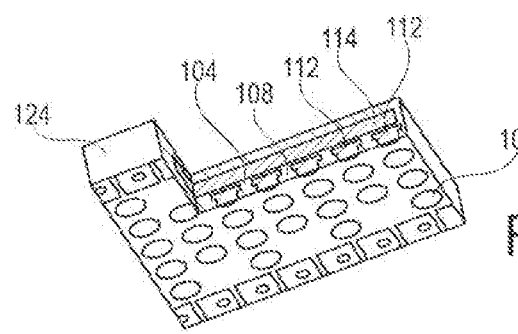

For instance, such a universal sheet pattern being illustrated in FIG. 54 as well can have dimensions of for example up to 600×600 mm$^2$.

FIG. 55 to FIG. 59 show further designs of packages 100 according to exemplary embodiments.

Figure 60:
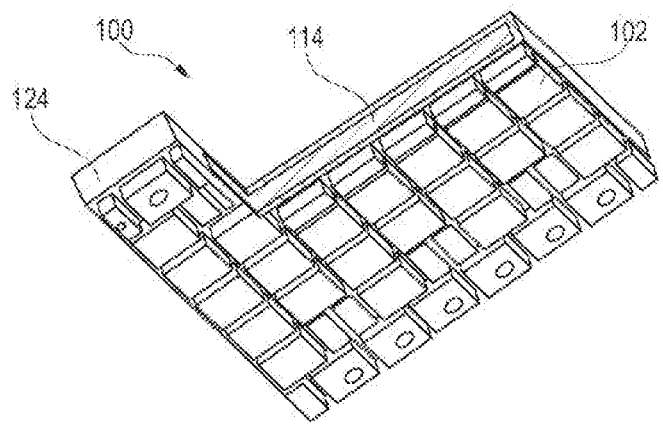
Figure 61:
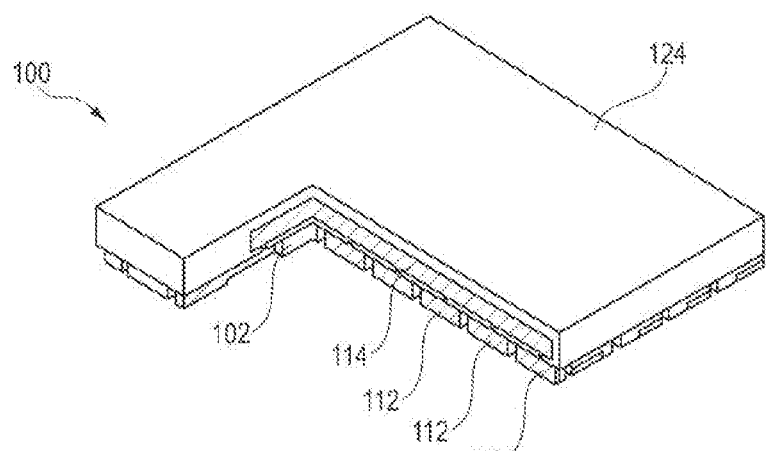
Figure 62:
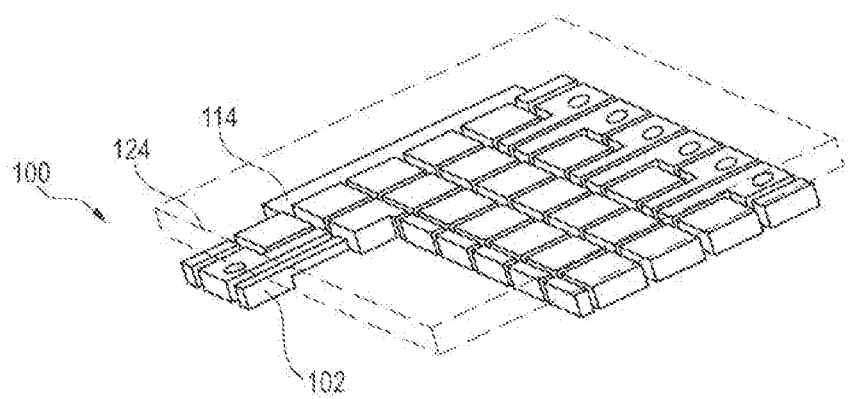
Figure 63:
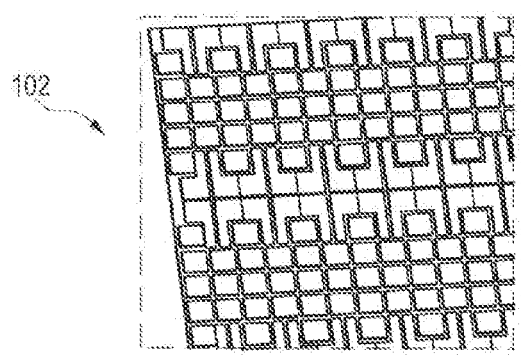
Figure 64:
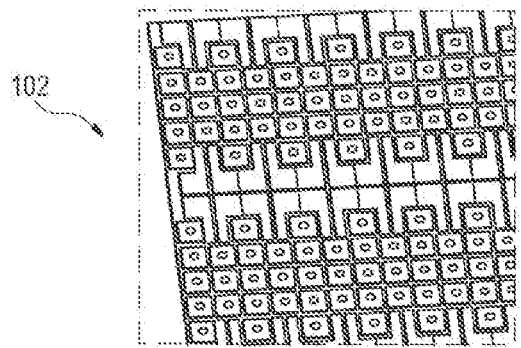
Figure 65:
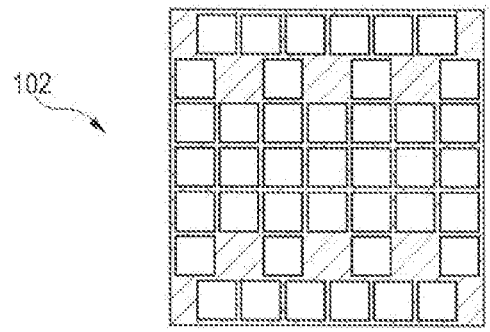
Figure 66:
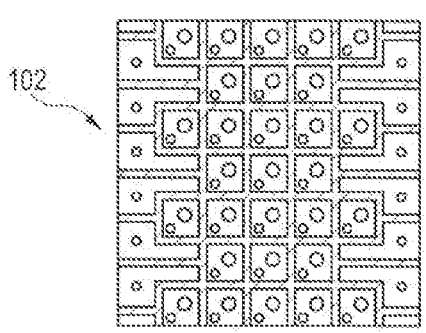
Figure 67:

In the packages 100 shown in FIG. 60 to FIG. 62, it is optionally possible to provide holes with mold compound only in outer pads. This may ensure an improved adhesion in particular where the stress is highest.

FIG. 63 to FIG. 67 show different views of a design of the substrate 102 of an LGA (land grid array)-BGA (ball grid array) package according to another exemplary embodiment. For instance, a half etched sheet may be used. Alternatively, round-shaped pads may be used. Full etch structures within contact pads may be implemented, for instance for a package with tin balls.

Figure 68:
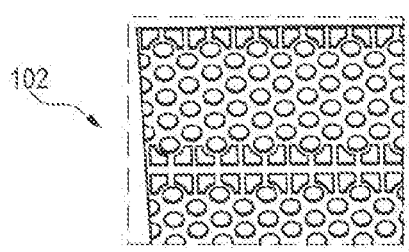
Figure 69:
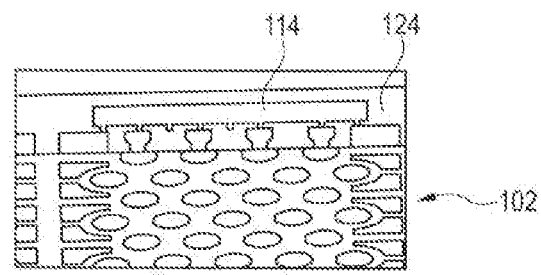

Referring to FIG. 68 and FIG. 69, a substrate 102 with a hexagon pad pattern with round shaped pads may be provided. This allows a higher density and a larger spacing.

Figure 70A:
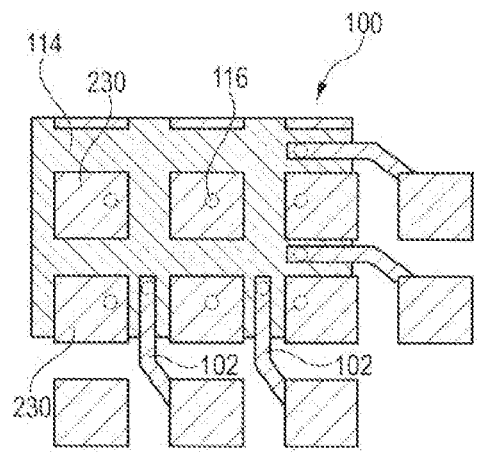

FIG. 70A shows a package 100 according to another exemplary embodiment with multi-side fan-out.

Figure 70B:
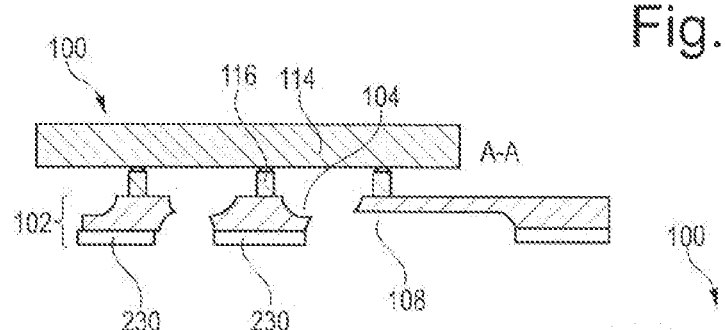

FIG. 70B shows a cross-sectional view of a package 100 with flipped copper pillar.

Figure 71:
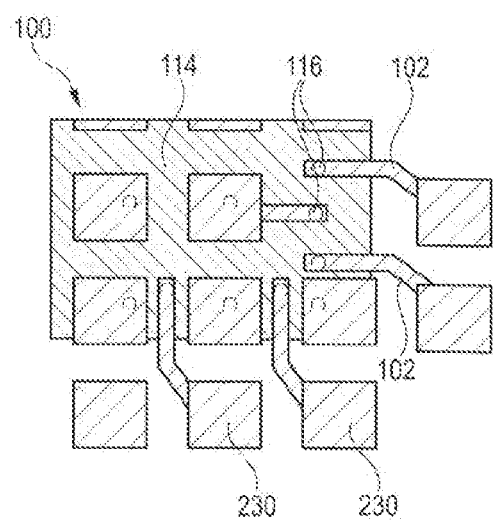

FIG. 71 illustrates a package 100 according to yet another exemplary embodiment with fan-in and fan-out options.

Figure 72:
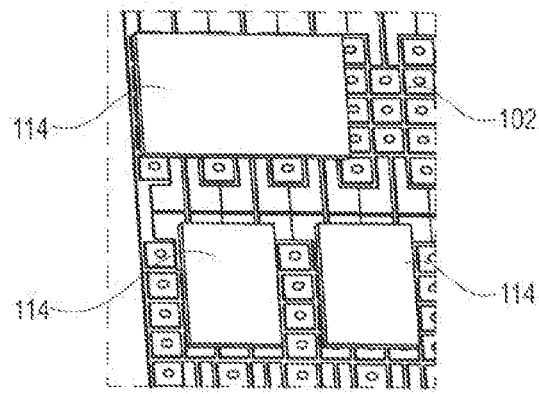

FIG. 72 shows a die type electronic component 114 on a structured (half-etched) copper sheet as substrate 102. FIG. 72 shows an embodiment in SiP (system in package) architecture comprising a plurality of (in the shown embodiment three) electronic components 114 mounted on the substrate 102.

FIG. 73 to FIG. 78 illustrate structures obtained during carrying out a method of manufacturing a package 100, shown in FIG. 78, according to another exemplary embodiment. For the sake of conciseness, FIG. 73 to FIG. 78 show two different embodiments, one on the left-hand side and one on the right-hand side of said figures. The two embodiments are visually separated by a respective vertical line.

In this embodiment, the method comprises mounting a temporary carrier 130 on the back side 110 of the substrate 102. Thereafter, the electronic component 114 and a sub portion of the substrate 102 are encapsulated by an encapsulant 124. Thereafter, the temporary carrier 130 may be removed from the substrate 102.

Referring to FIG. 73, a plate-shaped metallic (for instance copper) substrate 102 is shown having a plurality of second recesses 108 on its back side 110. Contrary to the previously described embodiments, the second recesses 108 are firstly formed, and only later the first recesses 104 will be formed. Thus, a half-etched copper plate processed from the back side 110 is shown in FIG. 73.

FIG. 74 shows a structure obtained after connecting a temporary carrier 130 to the back side 110. On the left-hand side of FIG. 74, the temporary carrier 130 is a metal plate (for instance an aluminium plate) pressed onto the back side 110 so as to also fill the second recesses 108 partially or completely. Alternatively, as shown on the right-hand side of FIG. 74, a glass plate may be glued using a thermoplastic material on the back side 110 of the substrate 102 without filling the second recesses 108.

FIG. 75 shows the result of a process of creating first recesses 104 in the front side 106 of the substrate 102, for instance by etching. As shown on the left-hand side, this may be accomplished by over-etching of the temporary carrier 130, thereby forming optional locking structures 174 of aluminium. As shown on the right-hand side of FIG. 75, top side etching of the copper plate may be accomplished for forming the first recesses 104 at the front side 106 of the substrate 102. This may create fan-in and/or fan-out structures or rerouting structures.

FIG. 76 shows the result of a die attach process. For instance, electronic components 114 with copper pillars as connection structures 116 may be used. Thus, FIG. 76 shows mounting of electronic components 114 on the front side 106 of the substrate 102.

According to FIG. 77, the structure shown in FIG. 76 is encapsulated, for instance by molding. As a result, empty spaces are filled with material of encapsulant 124.

In order to obtain the packages 100 shown in FIG. 78, the temporary carrier 130 may then be removed. Referring to the left-hand side of FIG. 78, this can be accomplished by etching the aluminium substrate highly sensitive to copper material. Referring to the right-hand side of FIG. 78, the glass substrate may be detached. This can be accomplished by a lift-off process or in a mechanical way.

Dicing may be carried out (in particular by metal-less dicing) to separate individual packages 100 after a panel level manufacturing process.

Again referring to the left-hand side of FIG. 73 to FIG. 78, the carrier 130 is advantageously inserted into the second recesses 108 of the substrate 102 according to FIG. 74. Thereafter and as shown in FIG. 75, the first recesses 104 are formed by etching. Simultaneously, material of the carrier 130 is removed from the second recesses 108, which are thereby exposed. Thereafter, the substrate 102 including its first recesses 104 and part of its second recesses 108 are encapsulated by encapsulant 124, as shown in FIG. 77. Thus, when etching the copper material of the substrate 102 according to FIG. 75, also aluminium material of the carrier 130 is removed from the cavities defining the second recesses 108. As a result, proper mold locking can be achieved as shown in FIG. 77. Advantageously, the aluminium material of the carrier 130 can then be etched selectively with respect to copper at the end. This procedure may remove the carrier 130, compare FIG. 77 and FIG. 78.

FIG. 79 to FIG. 82 illustrate structures obtained during carrying out a method of manufacturing a package 100, shown in FIG. 82, according to another exemplary embodiment. More specifically, FIG. 79 to FIG. 82 show a process of printing an electrically conductive paste 178, for instance a copper paste, on the front side 106 of the substrate 102 for promoting connection of the electronic components 114.

As shown in FIG. 79, the electrically conductive paste 178 may be printed by stencil printing on the front side 106 of the substrate 102 which is already separated in substrate sections 112 by forming first recesses 104 in the front side 106 and second recesses 108 in the back side 110 of the substrate 102. A temporary carrier 130 supports the substrate sections 112 from the back side 110. As shown in FIG. 80, a copper-copper interconnect may be established between the printed electrically conductive paste 178 and pads of the electronic components 114 which are assembled on the substrate 102.

Thereafter, the obtained structure may be encapsulated by encapsulant 124. Temporary carrier 130 may then be removed according to FIG. 81. According to FIG. 82, metal-less dicing may then be carried out for separating the individual packages 100 to thereby accomplish a high speed sawing, for instance by laser-cutting. In other words, the singularization separates the packages 100 by cutting exclusively through material of the encapsulant 124, see separation lines 231.

FIG. 83 to FIG. 88 illustrate structures obtained during carrying out a method of manufacturing a package 100, shown in FIG. 88, according to another exemplary embodiment. According to this embodiment, the connection structure 116 comprises a bond wire 164 connecting an upper main surface of the electronic component 114 with the front side 106 of the substrate 102.

The embodiment of FIG. 83 to FIG. 88 differs from the previously described embodiments in that silver plating for copper wires may be accomplished in a recess area, see reference sign 238 in FIG. 84. Furthermore, a clear resist stencil print may be carried out to form a sacrificial layer 239, see FIG. 85. As an alternative, a thermoplastic cavity injection may be carried out. Formation of encapsulant 124 may be carried out in the described embodiment by compression molding. After compression molding, material of the encapsulation 124 may be removed from the front side of the obtained structure, for instance by grinding or wet blasting of mold material of the encapsulant 124 to expose the sacrificial layer 239 (compare FIG. 87). The temporary carrier 130 may then be removed. Remaining exposed material of the sacrificial layer 239 may then be removed, for instance by wet etching, see FIG. 88. Advantageously, an LTI feature may be created by this embodiment. A proper mechanical interlocking may also be obtained.

Figure 93:
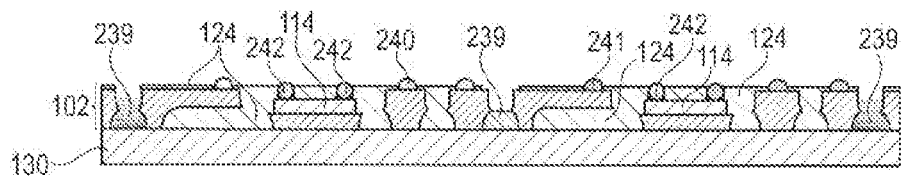
Figure 94:
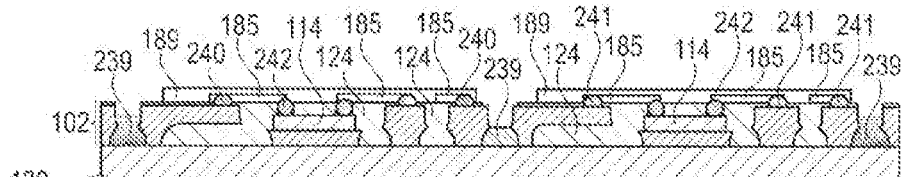
Figure 95:
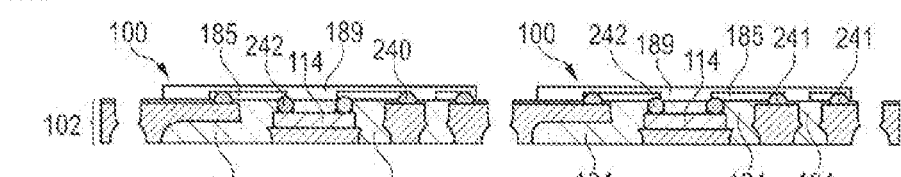

FIG. 89 to FIG. 95 illustrate structures obtained during carrying out a method of manufacturing packages 100, shown in FIG. 95, according to another exemplary embodiment.

The embodiment of FIG. 89 to FIG. 95 differs from the previously described embodiments by providing a redistribution layer flow with etched pins 240 (see left-hand side) and printed pins 241 (see right-hand side).

As shown by reference sign 240, pins may be etched (or coined) in the metal plate based substrate 102. As shown by reference sign 241, the pins may also be printed, for instance using a copper paste having for example a thickness of about 50 µm. Further pins 242 may be provided on the electronic components 114, compare FIG. 91. As shown in FIG. 92, a clear resist stencil print procedure may be carried out, see reference sign 239. Subsequently, encapsulation may be accomplished by compression molding to thereby create encapsulant 124 (see FIG. 92). Following the encapsulation, encapsulant material may be removed from the front side of the obtained structure, for instance using wet blasting. The pins 240, 241 may thereby be exposed, as shown in FIG. 93.

Thereafter, the exposed pins 240, 241 may be plated to thereby form plating structures 185 (compare FIG. 94). Moreover, a passivation resist may be formed on top of the obtained structure, see reference sign 189 (compare also FIG. 94). In order to obtain the separate packages 100 illustrated in FIG. 95, dicing by stripping can be carried out.

The described embodiment has the advantage that it makes use of the mold body of encapsulant 124 as dielectric layer for forming a redistribution layer.

Figure 96:
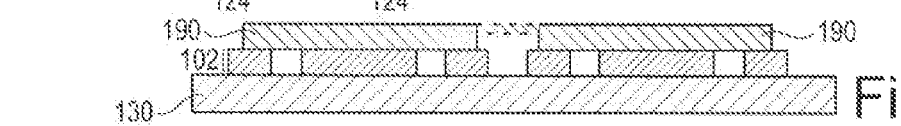
FIG. 96 to FIG. 103 illustrate cross-sectional views (FIG. 96 to FIG. 100) and plan views (FIG. 101 to FIG. 103) showing details of resist printing according to exemplary embodiments.
Figure 97:
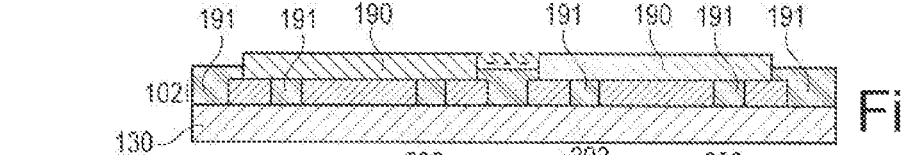
Figure 98:
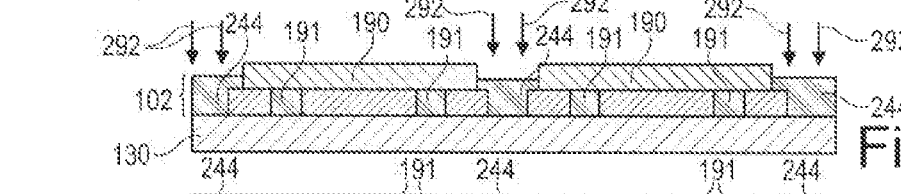
Figure 99:
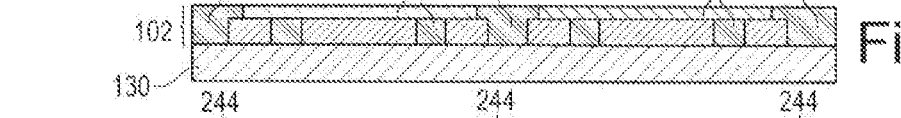
Figure 100:
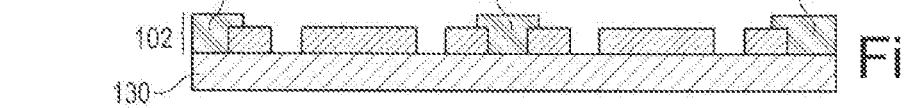
Figure 101:
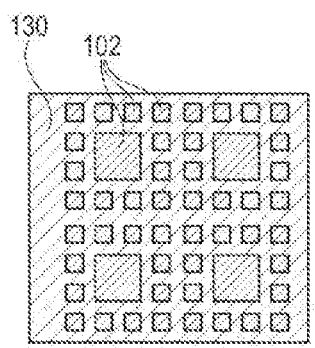
Figure 102:
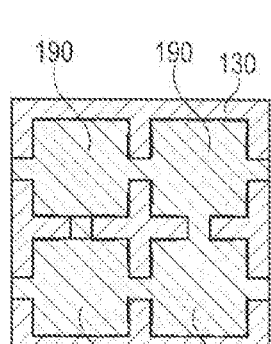
Figure 103:
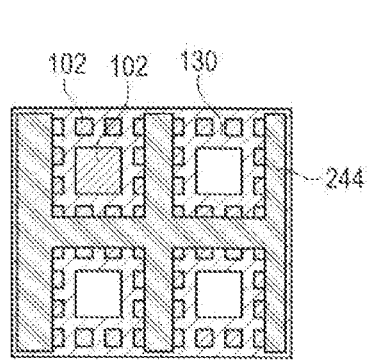
Figure 113:
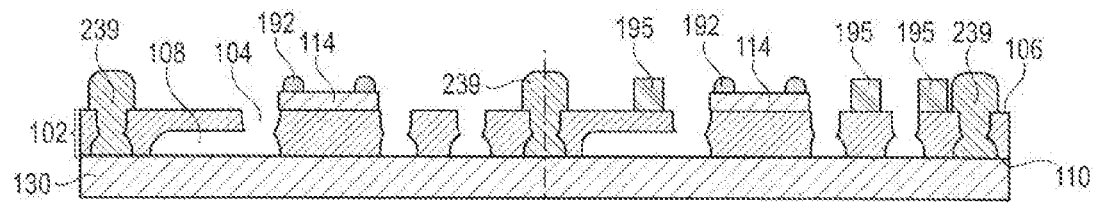
Figure 114:
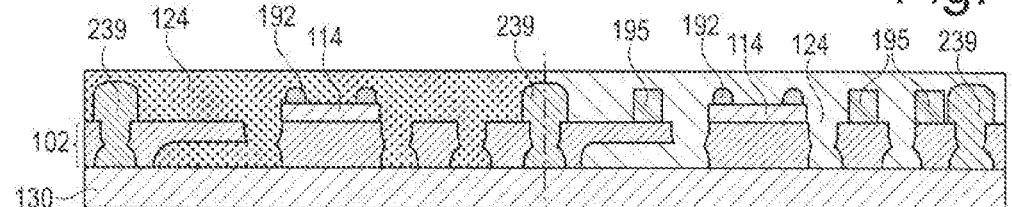

FIG. 96 to FIG. 103 illustrate cross-sectional views (FIG. 96 to FIG. 100) and plan views (FIG. 101 to FIG. 103) showing details of resist printing according to exemplary embodiments. Reference sign 190 indicates a stencil. A resist is shown with reference numeral 191. As indicated with reference sign 292, light exposure and resist development may be carried out. Illuminated resist is indicated with reference sign 244. FIG. 96 shows how a (for instance glass) carrier 130 has substrate 102 attached thereon. Stencil 190 is provided on top. FIG. 97 shows the structure of FIG. 96 with resist 191. According to FIG. 98, exposed portions of the resist 191 are illuminated (see reference sign 292) to thereby form portions of illuminated resist 244.

FIG. 104 to FIG. 110 illustrate structures obtained during carrying out a method of manufacturing packages 100, shown in FIG. 110, according to another exemplary embodiment.

The embodiment of FIG. 104 to FIG. 110 shows formation of packages 100 with a simple redistribution layer with balled dies. On the left-hand side of said figures, an embodiment with a plateable mold compound is illustrated as encapsulant 124. On the right-hand side, a normal mold compound is formed as encapsulant 124.

Electrically conductive balls 192, for instance copper balls, having for instance a dimension in a range between 40 µm and 60 µm, can be formed on the for instance semiconductor chip type electronic components 114, see FIG. 106. Advantageously, there are low tolerance requirements during this procedure. Electronic component 114 can be mounted in a cavity 193 formed by the recessed substrate 102, see FIG. 106. Advantageously, said cavity 193 should be large enough for glue or solder paste printing.

As shown in FIG. 107, a clear resist stencil print procedure may be carried out (compare reference sign 239). Encapsulation may be accomplished by compression molding. Following molding, a laser drill and laser activation process may be carried out on the left-hand side embodiment, compare FIG. 108. On the right-hand side of FIG. 108, wet blasting may be carried out to remove material of the encapsulant 124 from the front side of the shown structure. This may be a highly selective process. In both embodiments shown in FIG. 108, the electrically conductive balls 192 are thereby exposed. Thereafter, resist removal, plating (see reference sign 185 in FIG. 109) and dry resist formation (see reference sign 250 in FIG. 110) may be carried out. Finally, dicing or singularization of the individual packages 100 may be accomplished by etching, compare FIG. 110.

Figure 115:
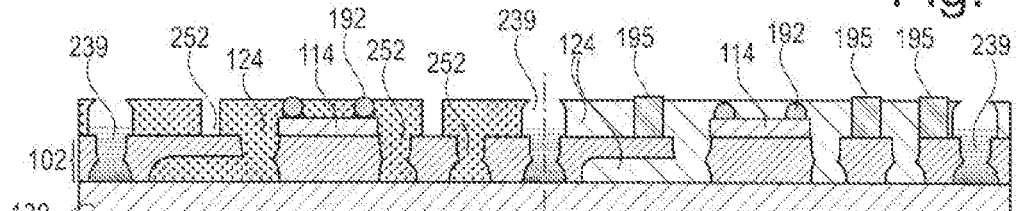
Figure 116:
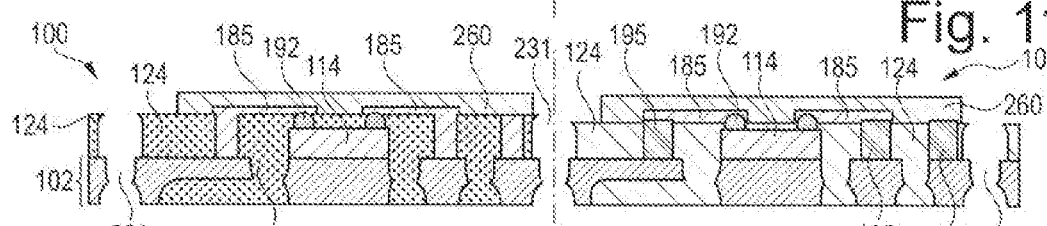
Figure 117:
FIG. 117 to FIG. 121 illustrate structures obtained during carrying out a method of manufacturing packages, shown in FIG. 121, according to another exemplary embodiment.
Figure 118:
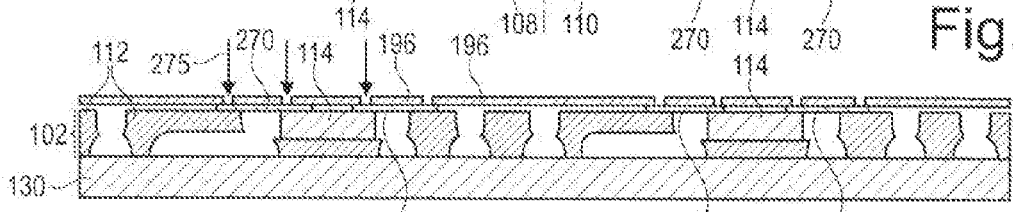
Figure 119:
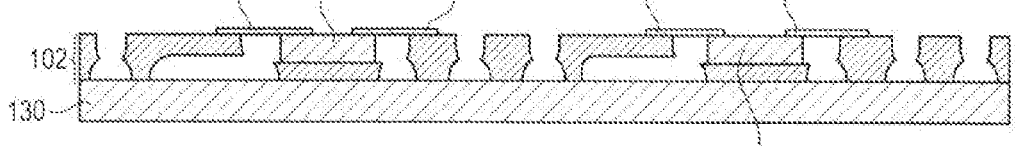

FIG. 111 to FIG. 116 illustrate structures obtained during carrying out a method of manufacturing packages 100, shown in FIG. 116, according to another exemplary embodiment.

The embodiment of FIG. 111 to FIG. 116 differs from the previously described embodiments by a plateau flow. As indicated by reference numeral 195, a jumper attach can be carried out. The jumpers 195 shown in FIG. 113 can be electrically conductive structures such as balls, columns, etc.

Referring to the left-hand side of FIG. 115, a laser drill and laser activation procedure can be carried out for exposing portions of the substrate 102, see access holes 252 in FIG. 115. Referring to the right-hand side of FIG. 115, a soft wet blasting procedure can be carried out, alternatively a grinding procedure, for removing material of encapsulant 124 from the front side of the shown structure. Thereafter, a plating (see reference sign 185), resist passivation (see reference sign 260), and carrier removal (see reference sign 130) and dicing by etching process can be carried out (see reference sign 231).

Figure 120:
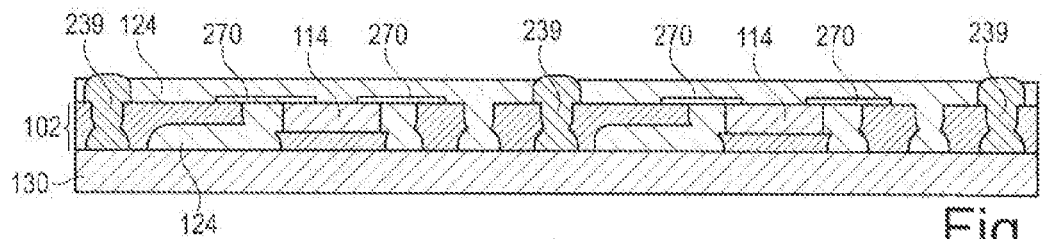
Figure 121:
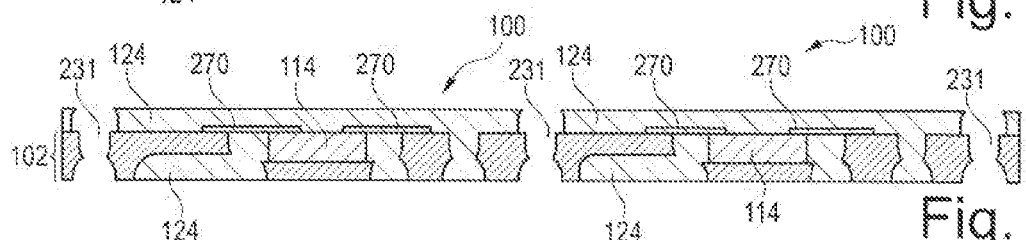
Figure 122:
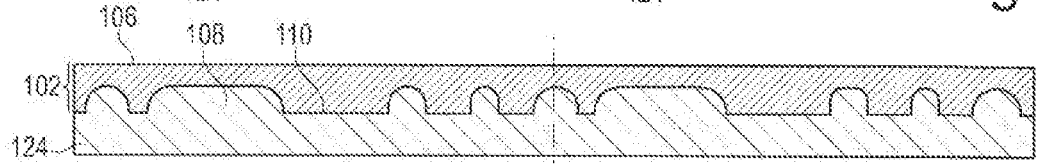
FIG. 122 to FIG. 126 illustrate structures obtained during carrying out a method of manufacturing packages, shown in FIG. 126, according to another exemplary embodiment.
Figure 123:
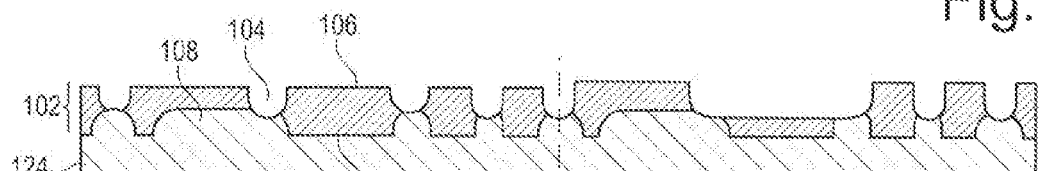
Figure 124:
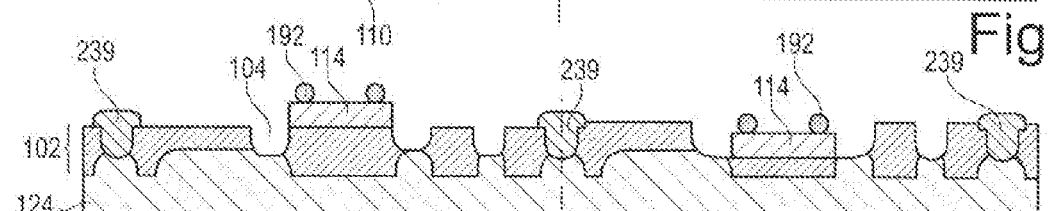
Figure 125:
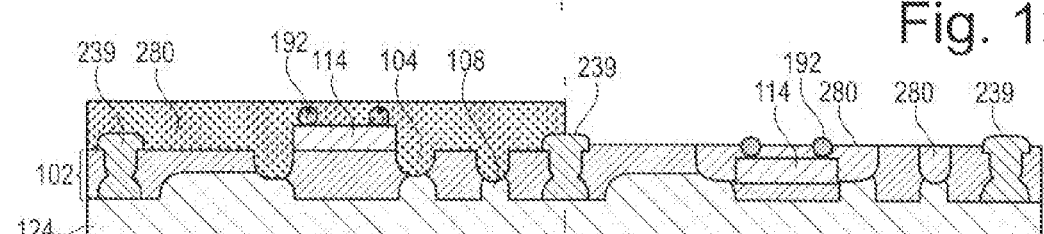

FIG. 117 to FIG. 121 illustrate structures obtained during carrying out a method of manufacturing packages 100, shown in FIG. 121, according to another exemplary embodiment.

The embodiment of FIG. 117 to FIG. 121 differs from the previously described embodiments by implementing a tape automated bonding process. A conductor trace transfer tape 196 may be used for this purpose which carries one or more conductor traces 270, see FIG. 117. The conductor traces 270 may be connected to the substrate sections 112 of substrate 102 and/or the electronic component 114 by laser welding, soldering or micro-cutting, as indicated schematically by reference sign 275 in FIG. 118. Thereafter, the transfer tape 196 may be removed by peeling or wet chemical dissolving (compare FIG. 119).

As shown in FIG. 120, sacrificial structures 239 and encapsulant 124 may be created as described above. Thereafter, temporary carrier 130 may be removed and singularization of the packages 100 may be accomplished as described above (see FIG. 121).

Figure 126:
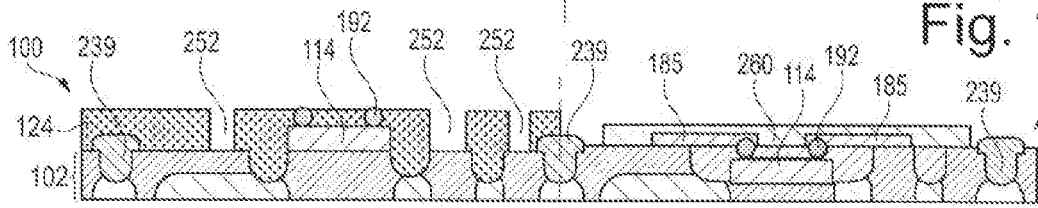
Figure 127:
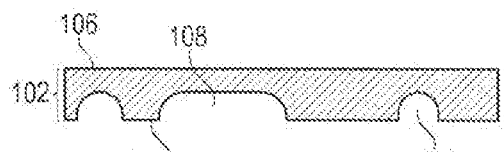
FIG. 127 to FIG. 132 illustrate structures obtained during carrying out a method of manufacturing packages, shown in FIG. 132, according to another exemplary embodiment.
Figure 128:
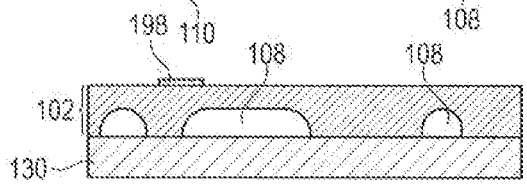
Figure 129:
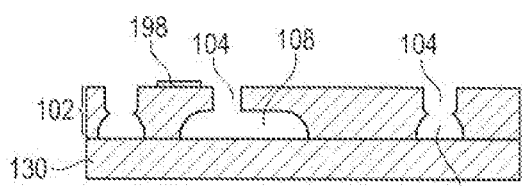
Figure 130:
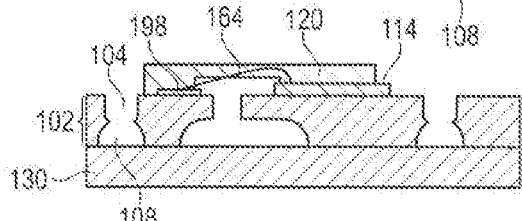
Figure 131:
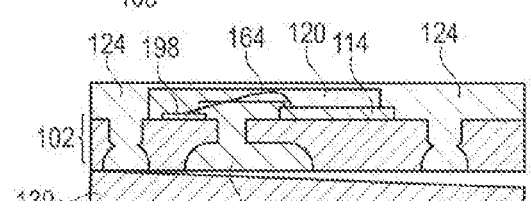

FIG. 122 to FIG. 126 illustrate structures obtained during carrying out a method of manufacturing packages 100, shown in FIG. 126, according to another exemplary embodiment.

The embodiment of FIG. 122 to FIG. 126 differs from the previously described embodiments by a reverse flow architecture. Again, the left-hand side shows a plateable mold compound as encapsulant 124, whereas the right-hand side shows a standard mold compound as encapsulant 124. As shown, after molding encapsulant 124 to the back side 110 of substrate 102 (already comprising back side recesses 108), second side etching of the substrate 102 is carried out to thereby form the front side recesses 104. After assembly of the electronic components 102 with electrically conductive balls 192, a further casting or molding process may be carried out to thereby form a second encapsulant 280. The plateable mold compound shown on the left-hand side as second encapsulant 280 can then be treated by laser drilling and laser activation to thereby form access holes 252. On the right-hand side, casting or molding may be carried out for forming second encapsulant 280. This may be followed by back side grinding or wet blasting. On the right-hand side, the structure may be front side-plated (see reference sign 185), and a passivation layer (see reference sign 260) may be formed. Thereafter, the packages 100 may be separated by a dicing-by-etching process or by wet chemical dissolving.

Figure 132:
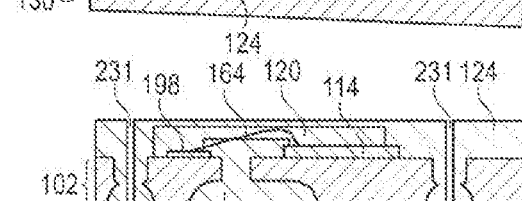
Figure 133:
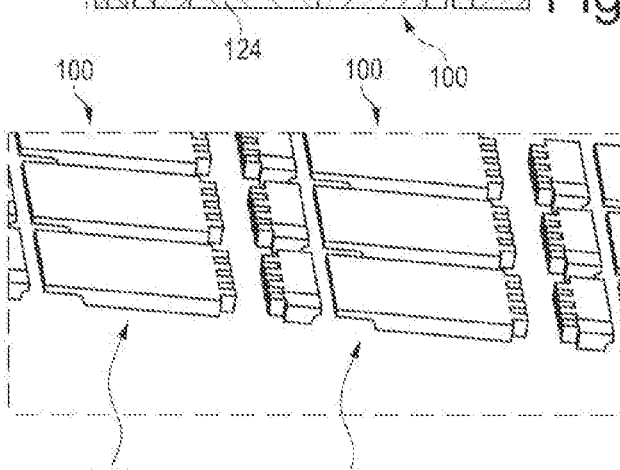
FIG. 133 illustrates a three-dimensional view of packages obtained according to FIG. 127 to FIG. 132.

FIG. 127 to FIG. 132 illustrate structures obtained during carrying out a method of manufacturing packages 100, shown in FIG. 132, according to another exemplary embodiment. FIG. 133 illustrates a three-dimensional view of packages 100 according to such as embodiment.

FIG. 127 to FIG. 133 show an embodiment which is particularly appropriate for power semiconductor devices. After half-etching the metallic plate type substrate 102 from the back side 110 for forming the recesses 108, a temporary carrier 130 may be attached from the back side 110. Thereafter, an electrically conductive pad 198 (for instance a silver spot) may be formed on the planar surface on the front side 106 of the substrate 102. Subsequently, a second half etch may be carried out for forming the recesses 104 at the front side 106. After attaching the electronic component 114 to the front side 106 of the substrate 102, a bond wire 164 and/or a clip 120 may be connected between the pad 198 and the electronic component 114. Thereafter, an encapsulation process may be carried out, for instance molding. After having formed the encapsulant 124 encapsulating the electronic component 114 and part of the substrate 102, temporary carrier 130 may be demounted. The individual packages 100 may be formed by a singularization process, for instance dicing.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, wherein the package comprises:
a substrate having at least one first recess on a front side and at least one second recess on a back side, wherein the substrate is separated into a plurality of separate substrate sections by the at least one first recess and the at least one second recess;
an electronic component mounted on the front side of the substrate;
a single encapsulant filling at least part of the at least one second recess;
an underfill between the front side of the substrate and the electronic component, the underfill also fills the at least one first recess at the front side of the substrate,
wherein the encapsulant fully circumferentially surrounds sidewalls of at least one substrate section of the plurality of substrate sections along at least part of a vertical extension of said at least one substrate section without being interrupted by said at least one substrate section along an entire vertical extension over which the encapsulant surrounds said at least one substrate section.

2. The package according to claim 1,
wherein the encapsulant fully circumferentially surrounds said sidewalls of said at least one of the substrate sections along at least part of the vertical extension of said at least one substrate section without being interrupted by said at least one substrate section so that the encapsulant disables a lateral electric access to said at least one substrate section along the entire vertical extension over which the encapsulant surrounds said at least one substrate section.

3. The package according to claim 1, wherein the at least one first recess has a different, in particular a smaller, lateral extension than the at least one second recess.

4. The package according to claim 1, wherein at least part of the substrate sections has a different, in particular a smaller, lateral extension at the front side than at the back side.

5. The package according to claim 1, wherein different substrate sections have different vertical extensions.

6. The package according to claim 1, comprising at least one further electronic component mounted on the front side of the substrate, wherein in particular the electronic component and the at least one further electronic component are arranged side-by-side or vertically stacked.

7. The package according to claim 1, wherein the encapsulant encapsulates only part of the substrate and/or at least part of the electronic component, in particular wherein a part of the electronic component is exposed with respect to the encapsulant.

8. The package according to claim 1, wherein the substrate further comprises at least one locking recess filled at least partially with the encapsulant to thereby lock the encapsulant with the substrate.

9. The package according to claim 8, wherein the at least one locking recess has a frustoconical shape.

10. The package according to claim 1, wherein the encapsulant and the underfill comprise different materials.

11. The package according to claim 1, wherein the underfill comprises an etch stop.

12. The package according to claim 1, comprising a connection structure connecting the electronic component with at least two of the separate substrate sections and holding together at least two substrate sections.

13. The package according to claim 12, wherein the connection structure comprises a clip connecting an upper main surface of the electronic component with the front side of the substrate.

14. The package according to claim 1, wherein the substrate sections are one of the group consisting of etched structures, laser machined structures, structures formed by additive metal deposition, structures formed by imprinting, structures formed by hot embossing, structures formed by milling, and structures formed by erosion.

15. The package according to claim 1, wherein a vertical end face of said at least one substrate section having sidewalls being fully circumferentially surrounded by the encapsulant is electrically connected to the electronic component and/or is exposed with respect to the encapsulant.

16. The package according to claim 1, wherein the at least one first recess and the at least one second recess together form at least one through hole extending through the substrate.

17. A package, wherein the package comprises:
a substrate having at least one first recess on a front side and at least one second recess on a back side, wherein the substrate is separated into a plurality of separate substrate sections by the at least one first recess and the at least one second recess;
a single encapsulant filling at least part of the at least one second recess;
wherein the encapsulant fully circumferentially surrounds sidewalls of at least one substrate section of the plurality of substrate sections along at least part of a vertical extension of said at least one substrate section without being interrupted by said at least one substrate section along an entire vertical extension over which the encapsulant surrounds said at least one substrate section;
an adhesive attach film attached to the front side of the substrate and filling the at least one first recess; and
an electronic component attached to the adhesive attach film.

18. The package according to claim 17, comprising a bond wire connecting a contact pad on an upper main surface of the electronic component to the front side of the substrate.

* * * * *